US006984925B2

(12) United States Patent
Morley et al.

(10) Patent No.: US 6,984,925 B2
(45) Date of Patent: Jan. 10, 2006

(54) LOW ACCELERATION SENSITIVITY MOUNTING STRUCTURES FOR CRYSTAL RESONATORS

(75) Inventors: Peter E. Morley, Amherst, NH (US); Reichl B. Haskell, Nashua, NH (US); Daniel S. Stevens, Stratham, NH (US)

(73) Assignee: Delaware Capital Formation, INC, Wilmington, DE (US)

( * ) Notice: Subject to any disclaimer, the term of this patent is extended or adjusted under 35 U.S.C. 154(b) by 154 days.

(21) Appl. No.: 10/446,522

(22) Filed: May 28, 2003

(65) Prior Publication Data

US 2004/0021402 A1 Feb. 5, 2004

Related U.S. Application Data

(60) Provisional application No. 60/383,835, filed on May 28, 2002.

(51) Int. Cl.
*H01L 41/053* (2006.01)
*H03H 9/09* (2006.01)
*H03H 9/15* (2006.01)

(52) U.S. Cl. .................. 310/348; 310/345; 310/351; 310/353

(58) Field of Classification Search ......... 310/344–353
See application file for complete search history.

(56) References Cited

U.S. PATENT DOCUMENTS

| 3,828,210 | A |   | 8/1974  | Livenick et al. |
|-----------|---|---|---------|-----------------|
| 3,909,639 | A | * | 9/1975  | Kawai et al. ................ 310/344 |
| 3,980,911 | A |   | 9/1976  | English |
| 4,130,771 | A | * | 12/1978 | Bottom ....................... 310/312 |
| 4,234,811 | A | * | 11/1980 | Hishida et al. ............. 310/348 |
| 4,266,157 | A |   | 5/1981  | Peters |
| 4,287,772 | A | * | 9/1981  | Mounteer et al. ............. 73/720 |
| 4,406,966 | A |   | 9/1983  | Paros |
| 4,430,596 | A |   | 2/1984  | Shanley |
| 4,451,755 | A |   | 5/1984  | Vig et al. |
| 4,486,681 | A |   | 12/1984 | Ishigami et al. |
| 4,639,632 | A |   | 1/1987  | Nakata et al. |
| 4,642,510 | A |   | 2/1987  | Yamashita |
| 4,666,547 | A | * | 5/1987  | Snowden et al. ........... 156/280 |
| 4,837,475 | A |   | 6/1989  | EerNisse et al. |
| 4,935,658 | A |   | 6/1990  | EerNisse et al. |
| 5,022,130 | A |   | 6/1991  | EerNisse et al. |
| 5,030,876 | A |   | 7/1991  | EerNisse et al. |

(Continued)

FOREIGN PATENT DOCUMENTS

EP 0 360 199 A2 3/1990

(Continued)

OTHER PUBLICATIONS

PCT International Search Report dated Nov. 5, 2003 of International Application No. PCT/US03/16722 filed May 28, 2003.

(Continued)

*Primary Examiner*—Thomas M. Dougherty
(74) *Attorney, Agent, or Firm*—Maine & Asmus

(57) ABSTRACT

The invention is a method and apparatus for improving the aging, pressure sensitivity, and acceleration sensitivity of crystal resonators. In one embodiment the invention includes a coplanar two-dimensional compliant mounting structure, wherein the symmetry and compliance of the planar mounting structure reduces the effects of residual static stresses and dynamic vibratory stresses on the vibration sensitivity performance of a crystal resonator. The structural elements include compliance loops that provide relief from the effects associated with manufacturing, thermal and vibration stresses.

19 Claims, 28 Drawing Sheets

U.S. PATENT DOCUMENTS

| | | | |
|---|---|---|---|
| 5,118,981 A * | 6/1992 | Kobayashi et al. | 310/329 |
| 5,168,191 A | 12/1992 | EerNisse et al. | |
| 5,572,082 A | 11/1996 | Sokol | |
| 5,604,472 A | 2/1997 | Uppaluri et al. | |
| 5,610,800 A | 3/1997 | Hundt et al. | |
| 6,246,013 B1 | 6/2001 | Yoshida et al. | |
| 6,300,707 B1 * | 10/2001 | Takehana et al. | 310/348 |
| 6,545,393 B2 * | 4/2003 | Iwasaki et al. | 310/348 |
| 6,550,329 B1 * | 4/2003 | Watson | 73/504.13 |
| 6,680,559 B2 * | 1/2004 | Ishitoko et al. | 310/348 |
| 2001/0033123 A1 | 10/2001 | Thanner | |

FOREIGN PATENT DOCUMENTS

| | | |
|---|---|---|
| GB | 2310534 A | 8/1997 |
| JP | 52-42088 * | 4/1977 |
| JP | 52-56882 * | 5/1977 |
| JP | 352056882 A | 5/1977 |
| JP | 357147314 A | 9/1982 |

OTHER PUBLICATIONS

Ballato, A. et al., The Force-Frequency Effect in Doubly Rotated Quartz Resonators, US Army Electronics Technology & Devices Laboratory, Ft. Monmouth, NJ, pp. 8-16.

Lukaszek, T.J. et al., Resonators for Severe Environments, US Army Electronics Technology & Devices Laboratory, USAERADCOM, Ft. Monmouth, NJ, pp. 311-321.

Tiersten, H. F. et al., An Analysis of the In-Plane Acceleration Sensitivity of Contoured Quartz Resonators with Rectangular Supports, Dept. O Mech. Eng., Aeronautical Eng. & Mechanics, Rensselaer Polytechnic Institute, Troy, NY, pp. 461-467.

Zhou, Y. S. et al., On the Influence of a Fabrication Imperfection on the Normal Acceleration Sensitivity of Contoured Quartz Resonators with Rectangular Supports, Forty-Fourth Annual Symposium on Frequency Control, Dept. of Mech. Eng., Aeronautical Engineering & Mechanics, Rensselaer Polytechnic Institute, Troy, NY, pp. 452-460.

Tiersten H. F. et al., The Increase in the In-Plane Acceleration Sensitivity of the Plano-Convex Resonator due to its Thickness Asymmetry, Forty-Fifth Annual Symposium on Frequency Control., Dept. of Mech. Eng., Aeronautical Engineering & Mechanics, Rensselaer Polytechnic Institute. pp. 289-297.

Eernisse, Errol P. et al., Distortions of Thickness Shear Mode Shapes in Plano-Convex Quartz Resonators with Mass Perturbations, IEEE Transactions on Ultrasonics, Ferroelectrics and Frequency Control vol. 37 No. 6, Nov. 1990, pp. 571-576.

Eernisse, Errol P. et al., Experimental Evidence for Mode Shape Influence on Acceleration-Induced Frequency Shifts in Quartz Resonators, IEEE Transaction on Ultrasonics, Ferroelectrics and Frequency Control vol. 37 No. 6, Nov. 1990 pp. 566-570.

Weglein R. D., The Vibration-Induced Phase Noise of a Visco-Elastically Supported Crystal Resonator, Forty-Third Symposium on Frequency Control, 1989, pp. 433-438.

Filler, Raymond L., The Acceleration Sensitivity of Quartz Crystal Oscillators: A Review, IEEE Transactions on Ultrasonics, Ferroelectrics and Frequency Control, vol. 35 No. 3 May 1988, pp. 297-305.

Stewart, J.T. et al., Design Optimization for Acceleration Sensitivity, 1998 IEEE International Frequency Control Symposium pp. 852-860.

Stewart. J. T. et al., Analysis of the Effects of Mounting Stresses on the Resonant Frequency of Crystal Resonators, 1997 IEEE International Frequency Control Symposium, pp. 621-629.

* cited by examiner

LOW ACCELERATION SENSITIVITY MOUNTING STRUCTURES FOR CRYSTAL RESONATORS

RELATED APPLICATIONS

This application claims the benefit of U.S. Provisional Application No. 60/383,835, filed May 28, 2002, which is herein incorporated in its entirety by reference.

GOVERNMENT LICENSE RIGHTS

Portions of the present invention were made in conjunction with Government funding under an Army contract number DAAB07-99-K764, and there may be certain rights to the Government which are hereby acknowledged.

FIELD OF THE INVENTION

This invention relates to crystal resonators and more particularly to mounting configurations that reduce asymmetry and mounting stresses which in turn leads to improved aging, pressure sensitivity, and acceleration sensitivity.

BACKGROUND OF THE INVENTION

As is well known in the field of frequency control, crystal resonators are used for providing highly precise frequency references for many applications. Piezoelectric quartz crystal resonators are commonly implemented in oscillators to provide highly accurate timing signals for communications, navigation and radar applications.

However, it is also well known that crystal resonators are susceptible to acceleration forces. For example, if a resonator is placed in a vibrating environment, the frequency of the resonator will be perturbed as a function of the vibration level. This degrades the stability of the resonator, and can compromise the performance of the system in which it is used. The poor performance is the result of frequency shifts and timing errors that occur when the resonator is subjected to stresses caused by acceleration or gravity.

The acceleration sensitivity of a resonator arises from forces imparted on the resonator element from the surrounding enclosure. These forces are transferred to the resonator through the mount structure. Rigidity and asymmetry of the mounting clips, manufacturing imperfections, and acoustic mode offset can result in a misalignment of the acceleration stress field and the acoustic mode center which has been shown to adversely impact acceleration sensitivity and degrade performance.

In a typical industry package, there is a package floor with posts extending to the outside. Flexible metal clips are connected from the post to the crystal and they retain the crystal. The clips are flexible and can be bent in a variety of ways. The clips are typically metal and conductive, and the quartz crystal is affixed to the clips. In conventional mounting configurations, the header is typically made of glass, together with a material such as Kovar, which is thermal expansion-coefficient matched to the sealing glass to provide a hermetic enclosure. The clips that connect the posts and the resonator can be made of a variety of materials, such as nickel or stainless steel. In either case, the thermal expansion coefficient of the quartz disc will not be matched to that of the header assembly. Crystal manufacturing processes usually involve high temperature operations such as adhesive curing, so as the assembly cools, the thermal expansion-coefficient mismatch produces residual stress applied to the resonator disc. And, this stress bias can result in an asymmetry or misalignment of the acceleration stress field and acoustic mode center.

There are existing systems that allow sufficient flexibility and retain the crystal by longer clips. However, these clips prohibit a low profile and are therefore inappropriate for certain applications requiring lower profiles. In addition, mechanical stresses on the clips are transmitted directly to the resonator. In prior mounting systems, attempts have been made to lower the packaging profile by making the clips shorter and shorter. But, the shortened clips are very stiff and do not adequately provide sufficient flexibility, and performance is degraded.

In one state-of-the-art embodiment, the crystal blank is mounted with its face perpendicular to the package terminations, and long mounting clips to attach the resonator plate. The mounting clips are in the plane of the crystal but are not symmetrical. Typically only two clips are utilized. Examples of this form of package header, whose bases are typically oval in shape, are the cold-welded types HC47/U, HC43/U and HC45/U. In such mount designs, the resonator is held perpendicular to the package header and retained by the longer clips, which reduces the stress, but increases the package profile. There are other prior configurations in which the crystal clips contact the blank at an angle ranging from around 40 degrees to substantially perpendicular or 90 degrees. In this type of configuration there are generally four clips used, but the mounting forces are not in the plane of the resonator. The resonator is held parallel to the package header and the clips keep the resonator in place, and the crystal face is parallel to the terminations. Examples of this form of TO-X holder, which are typically circular, are the cold-welded types HC40/U, HC37/U and HC35/U. Because of the possibility of four mounting points, and the short length of the mounts, the circular styles are particularly suited to low profile applications and to situations where the environmental conditions are harsh.

In a symmetrical mount, the stress field is symmetric with respect to the acoustic mode. In theory, if the stress field center from the symmetrical mount and the acoustic mode center are coincident, the sensitivity to vibration should be minimized. However, packaging imperfections and manufacturing stresses can create a misalignment of the stress field and acoustic mode center. For example, epoxy problems or shrinkage on a single clip may asymmetrically induce stress and cause misalignment. Mis-positioning of the resonator blank can also cause misalignment of the stress field and acoustic mode center.

The in-plane acceleration sensitivity of a plano-plano or bi-convex resonator, regardless of orientation, will vanish to the first order for a mounting structure that is perfectly symmetric with respect to the center of the acoustic mode shape. And for a plano-convex resonator, the in-plane acceleration sensitivity will nearly vanish, for example, a few parts in $10^{12}$ per g. This is supported by the articles by Tiersten and Zhou, entitled "An Analysis of the In-Plane Acceleration Sensitivity of Contoured Quartz Resonators with Rectangular Supports", Proceedings of the $44^{th}$ IEEE International Frequency Control Symposium, pp 461–467, 1990; and "The Increase in the In-Plane Acceleration Sensitivity of the Plano-Convex Resonator Due to Its Thickness Asymmetry", Proceedings of the $45^{th}$ IEEE International Frequency Control Symposium, pp. 289–297, 1991.

Also explained by Zhou and Tiersten, the normal acceleration vanishes to the first order for a perfectly symmetric structure, see "On the Influence of a Fabrication Imperfection on the Normal Acceleration Sensitivity of Contoured Quartz Resonators with Rectangular Supports", Proceedings of the 44th IEEE International Frequency Control Symposium, pp. 452–460, 1990. In fact, the normal acceleration sensitivity will increase linearly with offset. Thus alignment of the centers is extremely important in achieving low g-sensitivity.

In practice, however, this goal has been difficult to achieve, particularly in the context of the industry standard package styles readily available for mounting precision crystals.

Referring to prior art FIG. 1, FIG. 2, and FIG. 3, these figures show prior configurations that have two, three, and four point mounting locations, respectively. The resonator 5 is supported with thin metal clips 10, or ribbons, which extend down to the package base 25. In these conventional mounting systems, the mount is designed to accommodate differing thermal expansion coefficients between the package 25, the crystal material 5 and the mount clips 10. This is achieved by making the distance between the resonator 5 and the package base 25 sufficiently long or by making the material sufficiently compliant. This provides a stress relief effect, which is necessary for obtaining stability criteria such as good frequency aging performance. One of the drawbacks of this technique is that symmetry of the mounting structure is compromised, and under acceleration, the long and compliant clips will deform leading to asymmetry of the mounting structure. This, in turn, will lead to a misalignment of the acoustic mode and symmetric support centers. For the case of the three-point configuration (FIGS. 2a, b), the symmetry is further compromised to simplify assembly.

Manufacturing tolerances when assembling these types of resonators can also lead to a wide variation in acceleration sensitivity. Misalignment of the resonator mode and support centers, tilt of the blank with respect to the crystal base, and variations in the amounts of adhesive can all lead to a wide range of acceleration sensitivity for a given batch of resonators. Alignment of the blank is normally a manual process and the adhesive application can vary considerably from resonator to resonator. This can all lead to offset of the resonator mode and mount centers.

The importance of alignment of the mount and acoustic mode center is further stressed by the work done by EerNisse et al. which is described in U.S. Pat. No. 5,168,191; U.S. Pat. No. 5,022,130; U.S. Pat. No. 4,935,658; and U.S. Pat. No. 4,837,475, as well as in the following articles: E. P. EerNisse, L. D. Clayton, and M. H. Watts, "Distortions of Thickness Shear Mode Shapes in Plano-Convex Quartz Resonators with Mass Perturbations," IEEE Transactions on Ultrasonics, Ferroelectrics, and Frequency Control, vol. 37, no. 6, pp. 571–576, Nov. 1990; E. P. EerNisse, R. W. Ward, M. H. Watts, R. B. Wiggins, O. L. Wood, "Experimental Evidence for Mode Shape Influence on Acceleration-Induced Frequency Shifts in Quartz Resonators," IEEE Transactions on Ultrasonics, Ferroelectrics, and Frequency Control, vol. 37, no. 6, pp. 566–570, November 1990.

As disclosed in these various EerNisse articles and patents, the subject matter pertained to a process to move the acoustic mode center on finished resonator assemblies to improve acceleration sensitivity. Based on testing, there was an observed frequency shift caused by a 150 Angstrom film of Platinum deposited in a small pie-shaped area as a probe for mapping out the acoustic mode shape. Once the mode shape was mapped out, a patch of platinum was deposited onto the quadrant with the least amount of acoustic strength. The added mass resulted in greater energy trapping causing the mode center to move in the direction of the added mass. This resulted in a redistribution of the acoustic mode and a corresponding improvement in the acceleration sensitivity.

Although the technique results in improved acceleration sensitivity (low parts in $10^{10}$ per g of acceleration), the disadvantages of this technique are manufacturing time and cost. Probing a resonator with small patches of platinum and then depositing onto the weakest quadrant requires special tooling and considerable equipment time. Much time is also needed for quantifying the acceleration sensitivity numerous times.

Another effect that has not been explored in detail is the effect of residual static stresses on the dynamic acceleration sensitivity. The majority of the existing theory assumes that the resonator has a zero dc stress bias when the analysis is performed. In reality, residual static stresses may reside in the resonator due to the mounting clips and the adhesive expanding and contracting throughout the manufacturing process.

One approach to reducing these biasing stresses, as well as reducing the coupling of vibratory stresses, would be to use a compliant mounting structure, as proposed in the article by R. D. Weglein, "The Vibration-Induced Phase Noise of a Visco-Elastically Supported Crystal Resonator", Proceedings of the 43rd IEEE International Frequency Control Symposium, pp. 433–438, 1989. Weglein showed that low values of acceleration sensitivity could be achieved by using a visco-elastic adhesive for attaching the crystal to four rectangular mounting posts. Total Gamma values (<=) $3\times10^{-10}$ per g were reproducibly achieved for 100 MHz, 5th overtone resonators. The advantages of this technique are two-fold. First, any residual stresses due to manufacturing will relax in the compliant adhesive. Secondly, vibration that is normally coupled into the resonator through the mounting structure would be greatly reduced. However, the aging characteristics of the resonator may suffer due to the outgassing properties of most compliant adhesives.

Other works have demonstrated the importance of how stress can be coupled into a resonator causing a corresponding shift in the resonant frequency. In-plane diametric forces applied to the edge of a crystal resonator produce frequency shifts that are dependent upon the azimuthal angle $\Psi$ in the plane of the plate. This effect has been called the force-frequency effect and is thoroughly described in the article by A. Ballato, E. P. EerNisse, and T. Lukaszek, "The Force-Frequency Effect in Doubly Rotated Quartz Resonators", Proceedings of the 31st IEEE International Frequency Control Symposium, pp. 8–16, 1977. Their experimental and theoretical works demonstrated that the location of the mounting clips on the edge of the crystal resonator with respect to the resonators crystallographic x axis could be optimized to minimize the force-frequency effect. The optimal $\Psi$ angle and optimal clip arrangement was found to be dependent on the cut of quartz.

This clearly can be utilized to reduce the sensitivity of a resonator to an acceleration field, but does not account for gross misalignment or significant amounts of pre-biasing stresses that may exist within the resonator's support structure.

There have been many attempts to alleviate the aforementioned problems. In U.S. Pat. No. 4,406,966 there is a temperature compensated system that uses a spring or bellows support to connect to the resonator. The flexible bellows or springs have a coefficient of thermal expansion that is different than that of the resonator. The spring or bellows acts as a shock absorber to mitigate the vibration of the resonator. This system requires adding additional components to the package adding complexity and cost.

The resonator mounting of U.S. Pat. No. 4,639,632 describes a pair of lead-in conductors retaining a resonator in a flat package. The lead-in conductors contact one surface of the resonator and provide electrical connections to the outside of the package. There are U shaped portions shown that are intended to extend the heat conducting path from the external portions of the lead-in conductor to the projections contacting the crystal.

In U.S. Pat. No. 3,828,210, there is a mounting structure designed for housing one or more crystal plates. The housing has upper mount tabs that are 'L' shaped to provide some resiliency for thermal expansion as the connection is at the leg of the tab.

The temperature insensitive mounting described in U.S. Pat. No. 4,430,596 discloses using pedestals located at sweet spots, or axes in the X-Z plane of the crystal that are less sensitive to stresses. The axes at 60 degrees, 120 degrees and 240 degrees and 300 degrees were found to be insensitive to stresses generated in the crystal by thermal expansion of the substrate and crystal.

Stemming from the work reported by A. Ballato, E. P. EerNisse, and T. Lukaszek, "The Force-Frequency Effect in Doubly Rotated Quartz Resonators", Proceedings of the $31^{st}$ IEEE International Frequency Control Symposium, pp. 8–16, 1977, several new resonator structures were designed to take advantage of the optimal mounting angles $\Psi$ for various quartz resonator types. This is thoroughly described by T. Lukaszek and A. Ballato, "Resonators for Severe Environments", Proceedings of the $33^{rd}$ IEEE International Frequency Control Symposium, pp. 311–321, 1979 and in U.S. Pat. No. 4,454,443.

The quartz resonators were physically cut such that the optimal mounting angles would be achieved with a much wider mounting surface thereby reducing the concentration of stress caused by having a small mount point. The drawback of this technique is that the alignent and cutting of the resonators further complicates the manufacturing process increasing the process time and resonator cost.

Despite all the previous attempts in the art, there continues to be a need for improvement in the packaging of resonator elements to achieve improved symmetry and stress compensation resulting in improved aging, pressure sensitivity, and acceleration sensitivity.

BRIEF SUMMARY OF THE INVENTION

The present invention has been made in consideration of the aforementioned background. One object of the present invention is to provide a mounting configuration that greatly reduces the acceleration sensitivity of a crystal resonator. The invention is intended to be applicable to precision resonators and/or any application that requires the use of a piezoelectric transducer such as commonly found in bulk acoustic wave chemical, biological, or physical sensors.

The present invention is also applicable to dielectric resonators or any other type of resonator which may achieve improved performance through the use of a stress compensating structure.

One basic concept is to have a planar structure wherein the supports are in plane with the center of the crystal. There can be one or more loop relief structures integrated with the mounting elements that provide relief from manufacturing, thermal and vibration stresses. The mounting should be symmetrical to maintain the planes coincident. The structures are intended for low acceleration and low vibration sensitivity applications.

The structural mount elements are attached to the crystal by various schemes. In one embodiment, the elements are aligned and supported by a formed shelf and adhesive is used to glue the resonator in place. In another embodiment, the elements employ a finger or protruding lead-frame element that mates directly to the edge of the crystal. The formed alignment shelves can be used for assembly and then removed once the crystal is glued into place.

There can be any number of structural mount elements contacting with the crystal depending upon the application and desired results. In one embodiment the substrate houses a number of pedestals or posts around the periphery of the crystal and the user couples the structural mount element between the crystal and the pedestal as required by the application.

The compliance loop was initially considered to provide relief for the thermal expansion mismatch between the substrate, mount materials, and the quartz crystal. However, a surprising and unexpected result was the benefit from various other stresses that were mitigated by the compliance loops.

In the present embodiment, the crystal resonator element is in the form of a circular disc. The designs in which the structure has been implemented have been low frequency overtone resonators (e.g. 10 MHz $3^{rd}$ overtone), which was required for the other stability criteria. These blank designs are slightly lenticular in form, and any deviations in cross-sectional symmetry are small. The design concept of the present invention is in valid for any circular resonator, or indeed for any piezoelectric element design that exhibits some form of symmetry.

The basis of this invention is a crystal mount structure in which the asymmetries of the mount structure are minimized. The advantages of this design structure are three-fold. First, the alignment of the resonator's center plane with the plane of the mounting clips greatly reduces the asymmetry of the mounting structure due to a vibration field and thus reduces acceleration sensitivity. Secondly, the relief loops provide stress relief allowing the manufacturing stresses to be significantly reduced. Residual stresses will distort the symmetry of the dynamic vibration and cause a corresponding reduction in performance. Thirdly, the alignment of the blank with respect to the crystal mount is simplified due to the formed sections of the lead-frame. The positional tolerance of the blank is now a function of the forming tools instead of the assembler.

The invention in one embodiment is a resonator structure, comprising a resonator having a first side, a second side, and an outer edge. There is a mounting base having a planar surface, and the resonator is situated substantially parallel to the planar surface. A plurality of support structures, such as posts or notched pedestals, are located on the planar surface about the resonator, with a plurality of lead frames coupled to the support structures on a first end and coupled to the edge of the resonator on a second end. The lead frames and the resonator are substantially planar, and exert a substantially planar force on the resonator.

In one variation there are integrated compliance members in each of the lead frames. The compliance members include a rectangular relief loop, an oval relief loop, an arc relief loop, a serpentine, a spring, a zig-zag, and an elongated thin strip combined with a compliant adhesive.

Other variations include the resonator structure having four lead frames symmetrically situated about the resonator such that a pair of lead frames is opposing each other. In cases where the zero points have been identified, the lead frames can be positioned at some of the zero points, and even in combination with some lead frames at zero points and other lead frames at non-zero points. There can also be opposingly positioned lead frames at non-zero points to nullify force frequency response. The lead frames can be affixed to the resonator by an adhesive and can also include a lead frame shelf. There can also be a top member, wherein the lead frames are sandwiched between the support structures and the top member.

In order to provide electrical coupling, some of the support structures can be electrically conducting pins extending through the base, wherein one of the pins is electrically coupled to a top electrode of the resonator and one of the pins is coupled to a bottom electrode of the resonator. Jumper wires can also be used as is known in the art.

The resonator structure is generally any symmetrical shape, such as a circle, square, rectangle, hexagon, and octagon, however, any shape with symmetry would be applicable to the benefits derived from the present invention.

Another variation of the invention includes a hollow base member located around the resonator and in a same plane as the resonator. There are a plurality of lead frames coupled to the base member on a first end and coupled to a side edge of the resonator on a second end, wherein the lead frames applies a force in the same plane as the resonator.

Still other objects and advantages of the present invention will become readily apparent to those skilled in this art from the following detailed description, wherein we have shown and described only a preferred embodiment of the invention, simply by way of illustration of the best mode contemplated by us on carrying out the invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE INVENTION

Figure 1A:
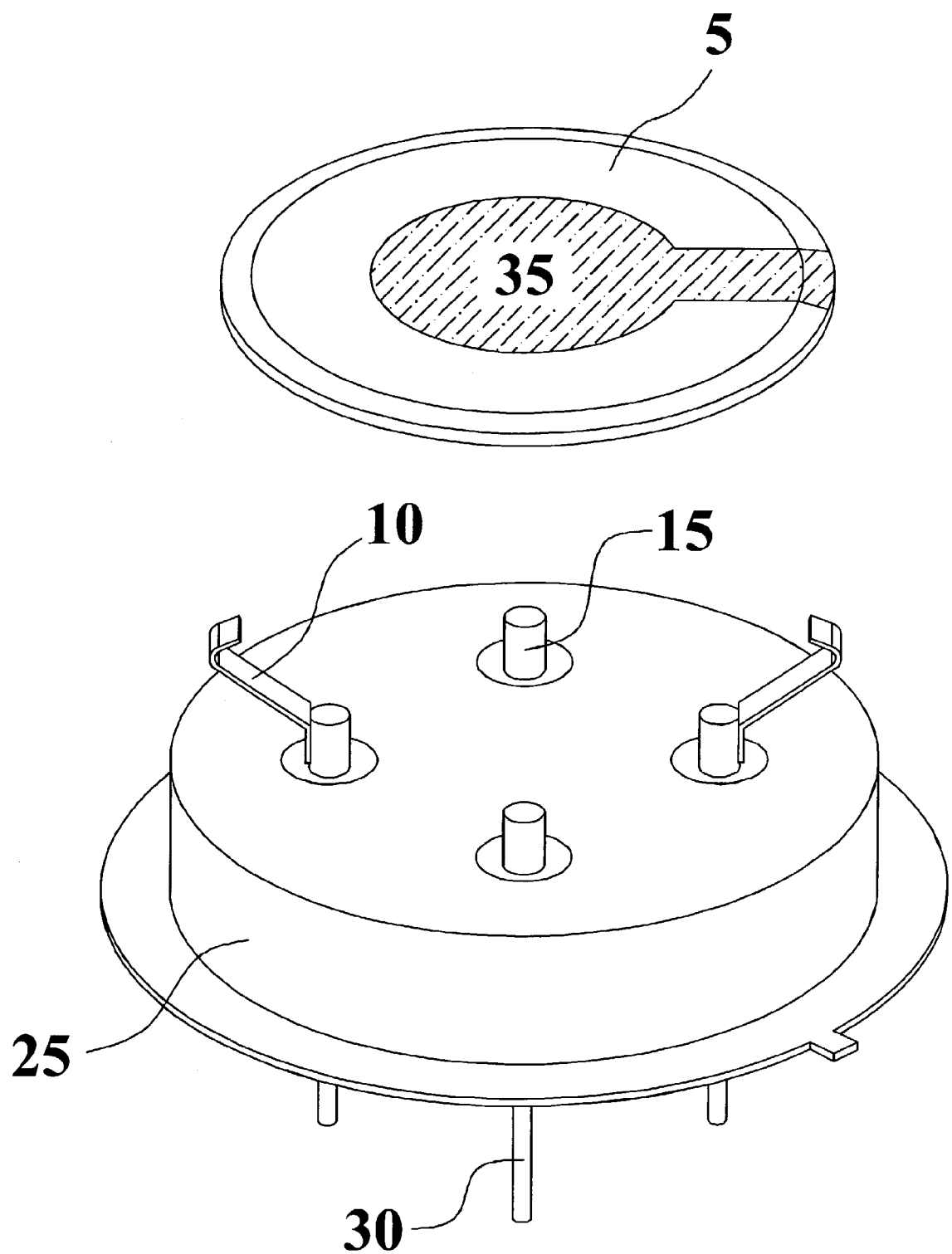
FIGS. 1a, b are detailed top and side perspective drawings of a prior art two-point mounting structure. The package is a TO-X style cold weld header with metal ribbon clips welded to the posts.
Figure 1B:
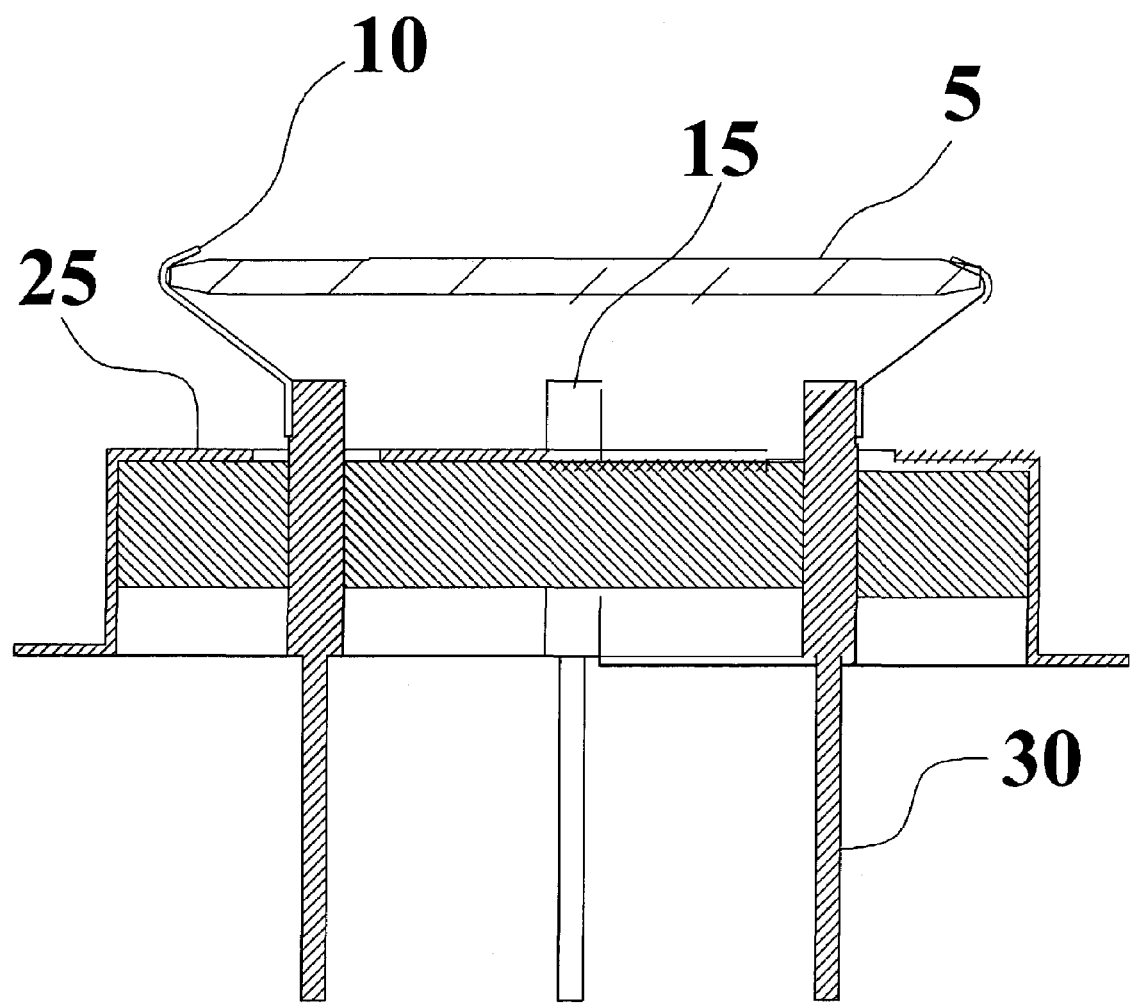
Figure 2A:
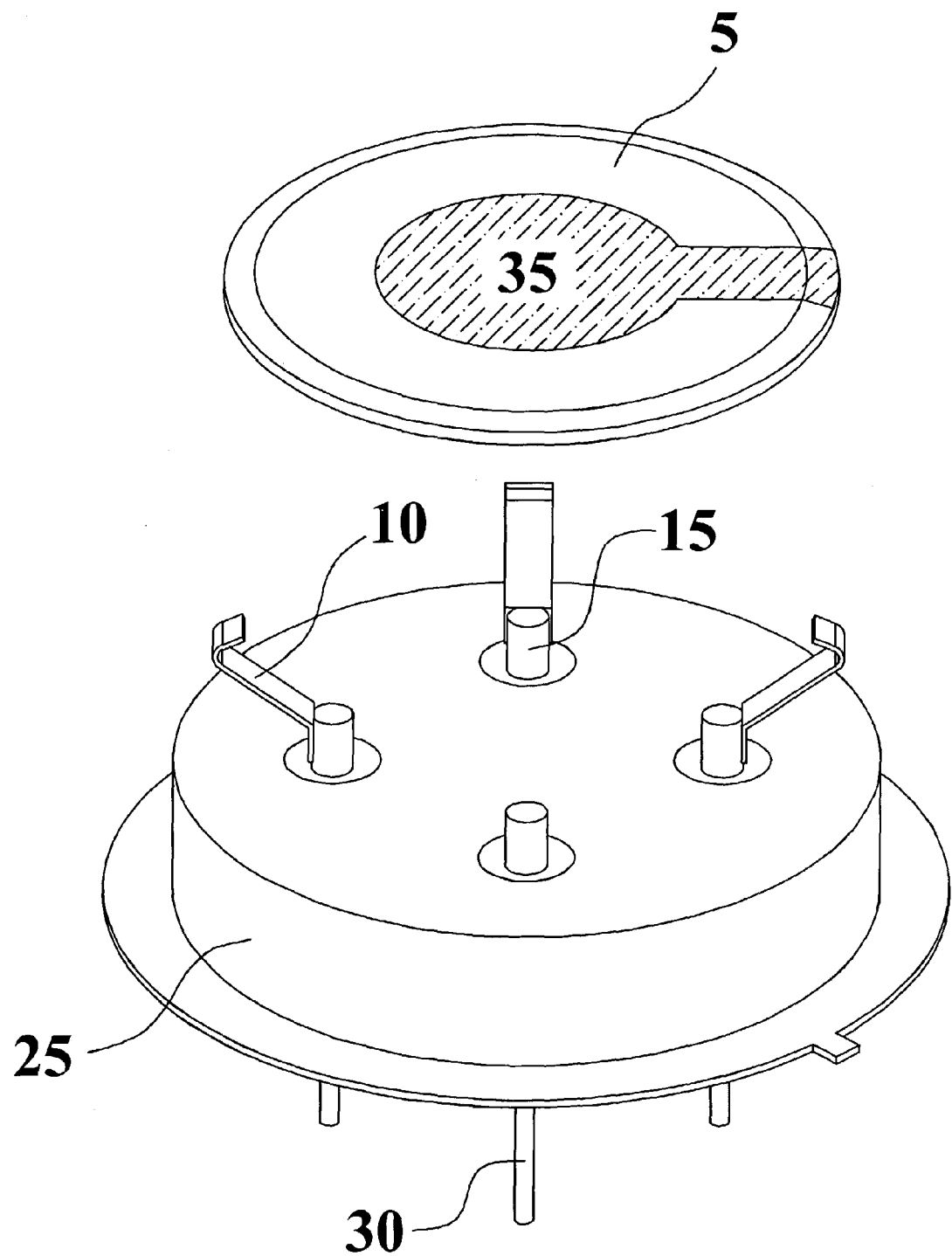
FIGS. 2a, b are detailed top and side perspective drawings of a prior art three-point mounting structure. The package is a TO-X style cold weld header with metal ribbon clips welded to the posts.

Referring to prior art FIGS 1a, b perspective views of a 2-point mounting structure is illustrated. FIGS. 2a, b and FIGS. 3a, b are variations of FIGS 1a, b showing a three-point mounting and four-point mounting respectively. The package is shown as a circular TO-X style assembly with rigid posts 15 for attaching the clips 10. The clips are typically secured to the posts 15 by welding, brazing, adhesive, or solder. The resonator element 5 is shown suspended between the mounting clips 10 at the two mounting points approximately opposing in this presentation.

Figure 2B:
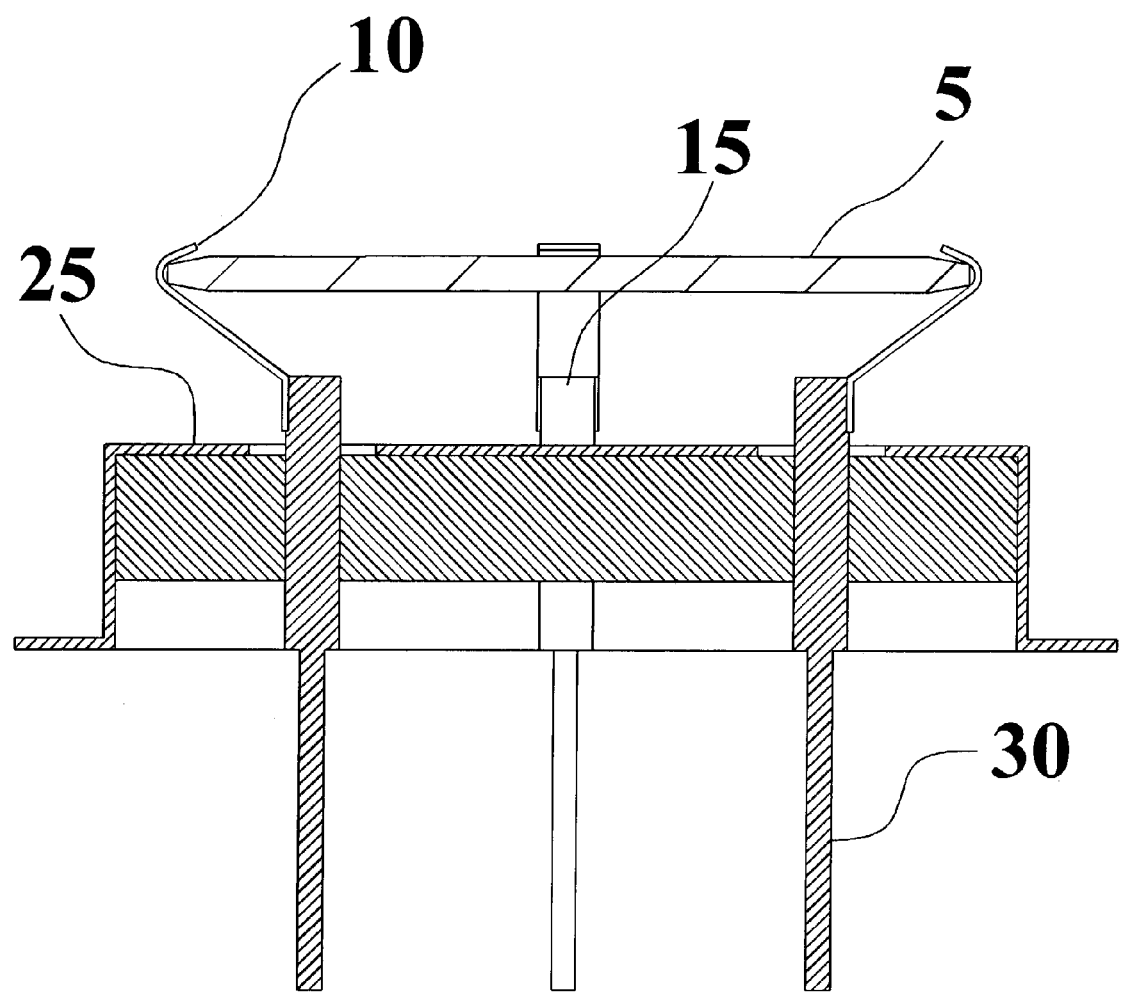
Figure 3A:
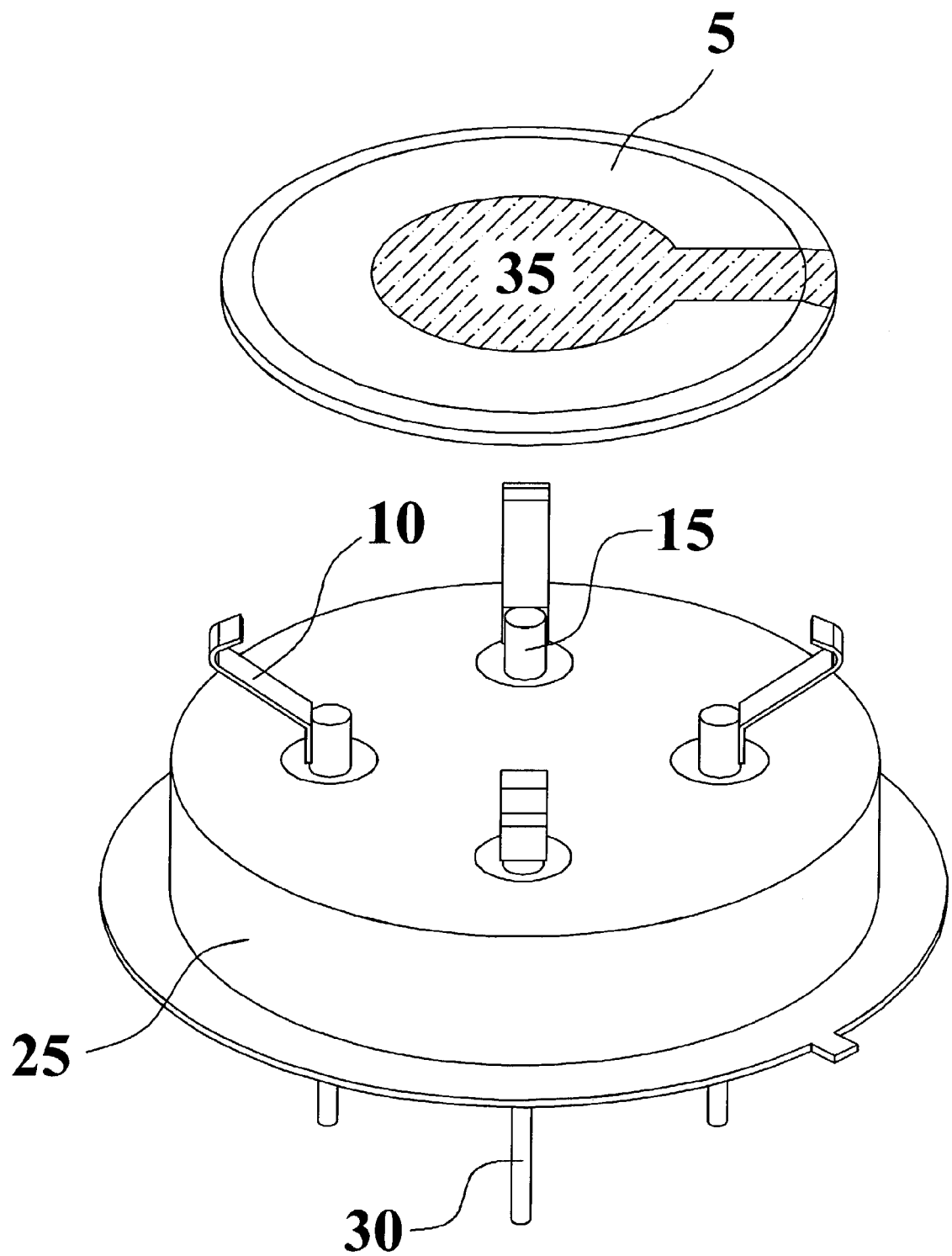
FIGS. 3a, b are detailed top and side perspective drawings of a prior art four-point mounting structure. The package is a TO-X style cold weld header with metal ribbon clips welded to the posts.
Figure 3B:
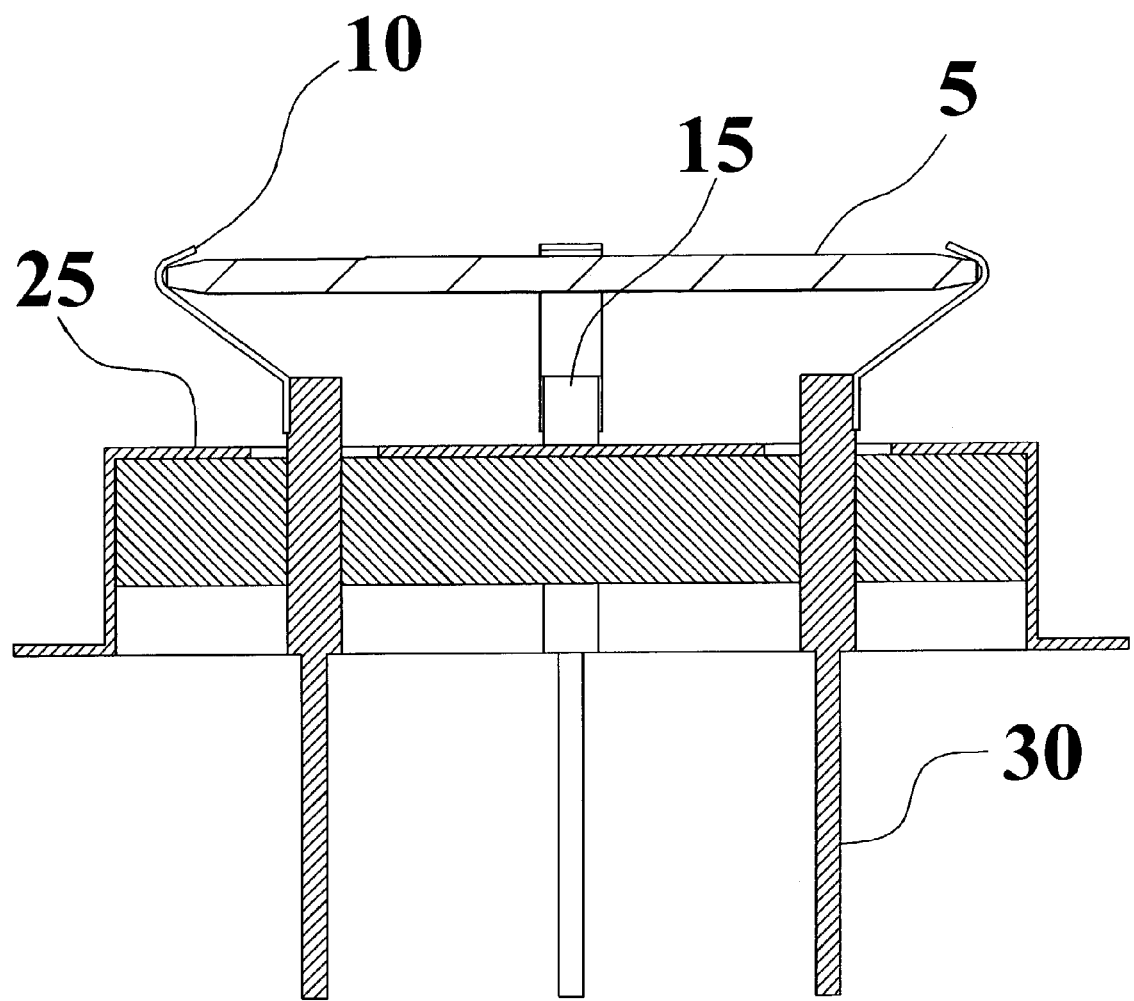

The electrical leads 30 connect through the kovar/glass base or header package 25 to the mounting clips 10. The clips 10 retain the resonator 5 in position above the package 25 with a combination of vertical and horizontal forces. One of the clips 10 is coupled to the top electrode 35 of the resonator 5, while oppositely positioned clip 10 connects to the bottom electrode (not shown). Electrical connectivity between the clips 10 and the top electrode 35 and bottom electrode (not shown) is accomplished via conductive adhesive or solder. As shown, the resonator is held at two points by two angular clips 10 that extend upwardly and at an angle from the rigid posts 15. These point mountings do not provide sufficient acceleration sensitivity performance as described herein and proven during testing. FIGS. 2a and 2b illustrate the asymmetry of the three-point mounting having three clips 10 retain the resonator 5. FIGS. 3a and 3b show four angled clips 10 retaining the resonator 5, wherein the forces that retain the clip 10 are not planar with the resonator 5.

Figure 4A:
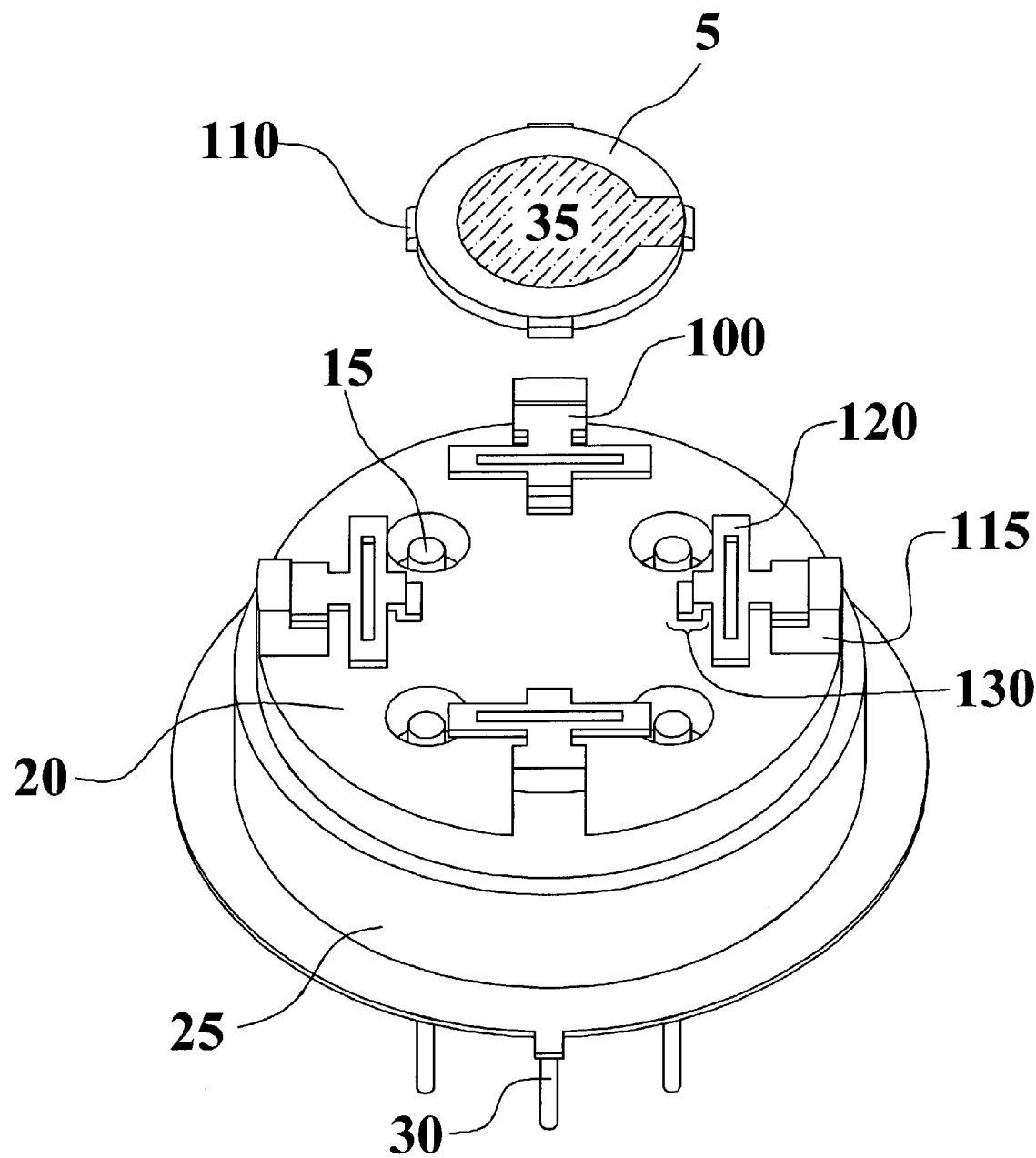
FIGS. 4a, b are detailed top and side perspective drawings of a quad mount relief (four-point) structure with formed crystal alignment tabs and a machined or molded ceramic mounting base. The example shown is mounted onto a TO-X style header and can be electrically connected with bonding wires (not shown)
Figure 4B:
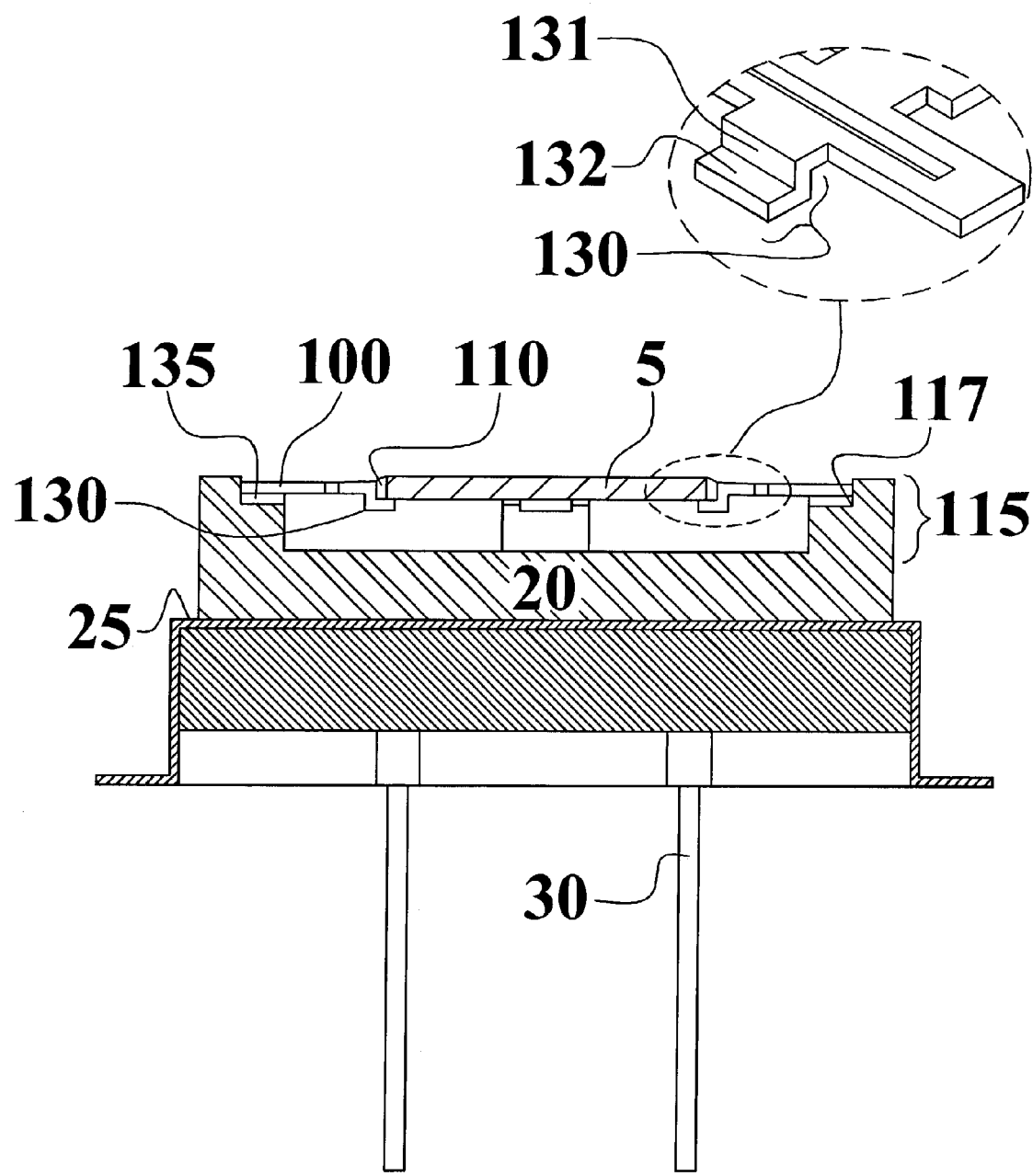

FIG. 4a is a top perspective view of the present invention having formed crystal alignment tabs 130 and a machined or molded ceramic mounting base 20. The resonator 5 is held in place by a plurality of lead frames 100 incorporating relief loops 120 that are in the same plane as the center plane of the resonator 5. In one embodiment, the lead frame 100 is shown attached to the notched ceramic pedestal 115 by an adhesive 135. Other attachment means for connecting the lead frame 100 to the pedestal 115 are within the scope of the invention. Unlike prior mounts that have clips extending angularly from the base, the lead frame 100 of the present invention extends in the same plane as the center plane of the resonator 5, and provides a planar retaining force. The pedestal 115 has a notch 117 which includes a backstop portion wherein the lead frame 100 rests against the pedestal backstop of the notch 117.

The entire assembly is then mounted onto a TO-X header 25 and electrically connected to the electrically conducting pins 15 using bonding wires (not shown). In this illustration, the pins 15 are accessible through holes in the mounting base 20 thereby allowing the electrical connectivity. The top electrode 35 is coupled to one of the pins 15 and the bottom electrode is coupled to one of the pins via the bonding wires (not shown). Various means for electrical connectivity are known to those in the art and described in further detail herein.

In this embodiment, there is a compliance or relief loop 120, which in this illustration is rectangular. The relief loop 120 provides certain beneficial attributes to packaging stresses and improves aging, pressure sensitivity, and acceleration sensitivity. While the relief loop 120 provides certain benefits, there are substantial benefits solely in applying the planar retention force as opposed to the non-planar holding forces used in the art. The application of the retaining force applied in the same plane as the center plane of the resonator 5 provides great benefits by minimizing out-of-plane stresses.

Additionally, choice of the resonator's 5 mounting locations with respect to the crystallographic x-axis results in further reduction of coupled stress. Pairs of lead frame mounts 100 can be located at zero points wherein there is minimal frequency response when force is applied at these points, or at complementary positions wherein one pair of mounts results in a positive frequency shift and the other results in a negative frequency shift with the superposition of the two pairs resulting in minimized coupled stress.

In this embodiment the lead frame 100 is retained within a notch 117 on the pedestal 115. The notch 117 is shown as being about 90 degrees, although other angles and cut-outs are within the scope of the invention. Additionally, the pedestal 115 can have a top component that serves to 'sandwich' the lead frame 100 and hold it in place. The top component (not shown) can be clipped or glued to the ceramic pedestal 115 and can also be an element of the lid assembly (not shown).

The lead frame 100 is shown as being affixed to the resonator 5 by an adhesive 110. There is a tongue portion or formed lead-frame shelf or crystal tabs 130 that helps to support and align the resonator 5 during the manufacturing process. The formed lead-frame shelf 130 is used for assembly to enable an auto-alignment of the resonator 5. The formed lead frame shelf 130 has an angled portion 131 and a retaining portion 132. The angled portion 131 allows the resonator 5 to be guided onto the retaining portion 132 and is generally about 90 degrees, although lesser angles also satisfy the guiding and alignment feature. The retaining portion 132 is the rim upon which the resonator 5 sits, usually held in place with an adhesive 110. The rim 132 is substantially parallel to the surface of base 20.

It should be readily apparent that the adhesives 135 and 110 should be conductive in those implementations that require electrical conductivity while a non-conductive adhesive can be employed where electrical conductivity is not a requirement. Referring to the adhesives described herein, the adhesives are those known in the art with satisfactory properties for aging, conductivity, and outgassing. There are numerous adhesives that can be used, including epoxy, polyimide, or silicone based adhesives. For lower cost, less precision resonators, a lower temperature cure epoxy (conductive and non-conductive) may be used. For more precise resonators that require very high Q and low aging characteristics, a higher cure temperature polyimide (conductive or non-conductive) can be used. This is because these high Q resonators are typically sealed in vacuum and require an adhesive with low out-gassing properties. A silicone based adhesive could possibly give some vibration isolation, but the drawback would be the outgassing properties of the silicone. In general, the non-conductive adhesives are usually superior to the conductive adhesives and employed wherever there is no electrical path.

Figure 5A:
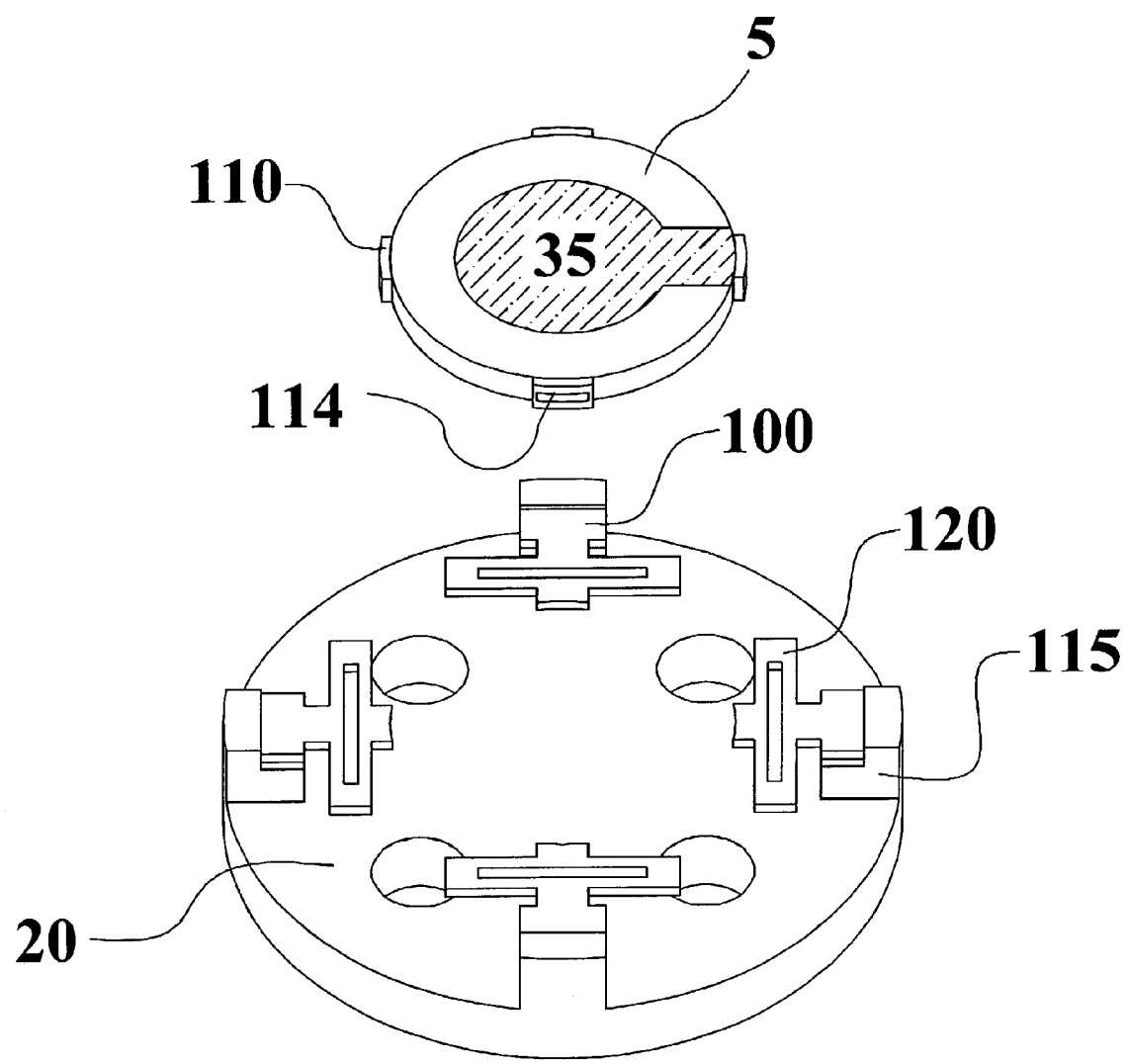
FIGS. 5a, b are detailed top and side perspective drawings of a quad mount relief structure with connections directly to the sides of the crystal and a machined or molded ceramic mounting base. The shown assembly can be mounted on or integrated within a variety of electronic package headers/enclosures (not shown) and electrically connected with bonding wires (not shown)
Figure 5B:
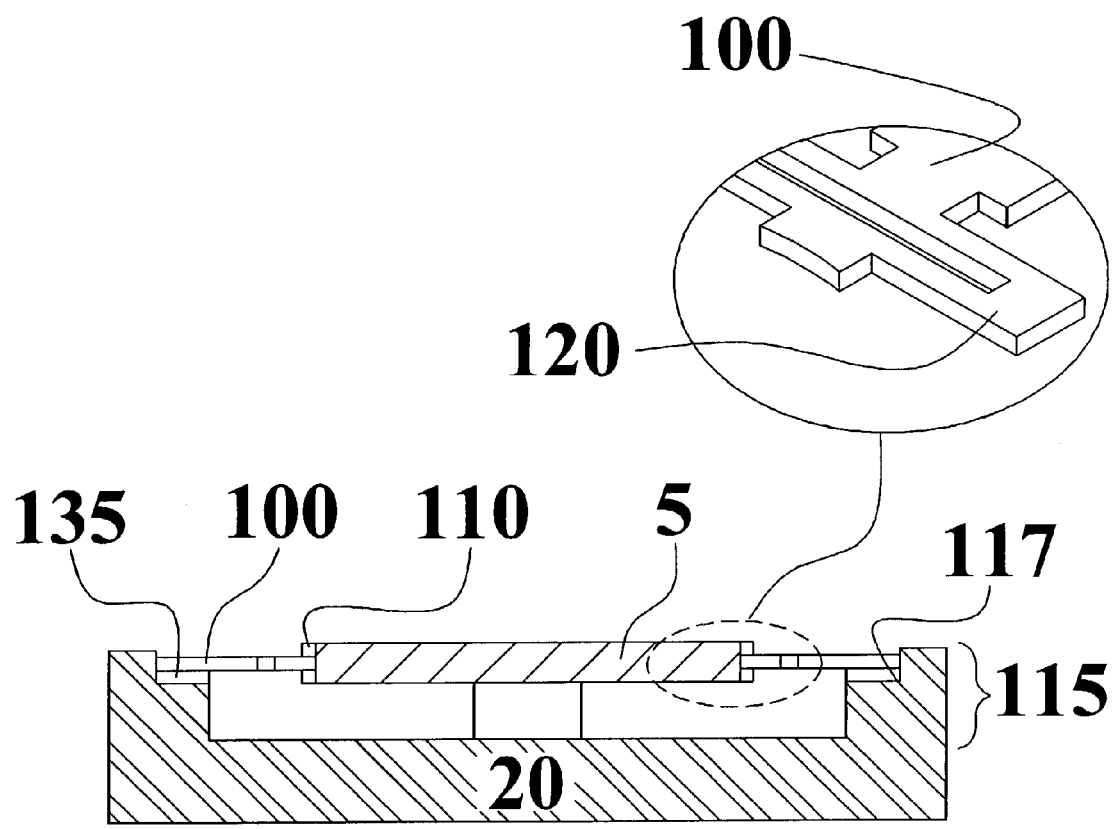

Referring now to FIG. 5a, another attachment scheme is depicted that uses a separate formed shelf alignment/support structures (not shown) for assembly only, while the actual lead-frame 100 that couples to the rectangular relief loop 120 connects directly to the side of the crystal resonator 5 as shown in FIG. 5b. In the preferred embodiment, the present invention is a quad relief structure with a four point mount symmetrically retaining the resonator 5 with a force exerted along the same plane as the center plane of the crystal 5. It is worth noting that the shown structure can be mounted onto the base of an electronic package (not shown) and electrically connected to the package pins using bonding wires (not shown). The lead frame 100 is this embodiment has an extended portion 122 that would directly interface with the side of the crystal 5. In certain embodiments the crystal 5 can employ indents or cut-outs 114 in the crystal 5 or the adhesive 110 that would receive the extended portion 122.

As detailed herein, one of the unique attributes of the present invention is the compliance loop 120 that is an integral part of the lead frame 100. The rectangular relief loop 120 is used to mitigate any residual stresses that may be present due to expanding or contracting adhesive curing and lead-frame 100 annealing. The relief loop 120 allows for flexure of the lead frame 100 and test results demonstrate significant improvements in performance utilizing the loops 120.

The dimensions and shape of the stress-relief loops 120 are chosen to allow adequate compliance while supplying adequate strength to allow the assembly to comply with environmental requirements. The loops 120 can be rectangular, arcuate, ovals, and non-loop variations with bulbous or circular ends to allow different forces to be mitigated. The type of loop for a particular application depends on many factors and is generally based upon empirical testing.

Figure 6A:
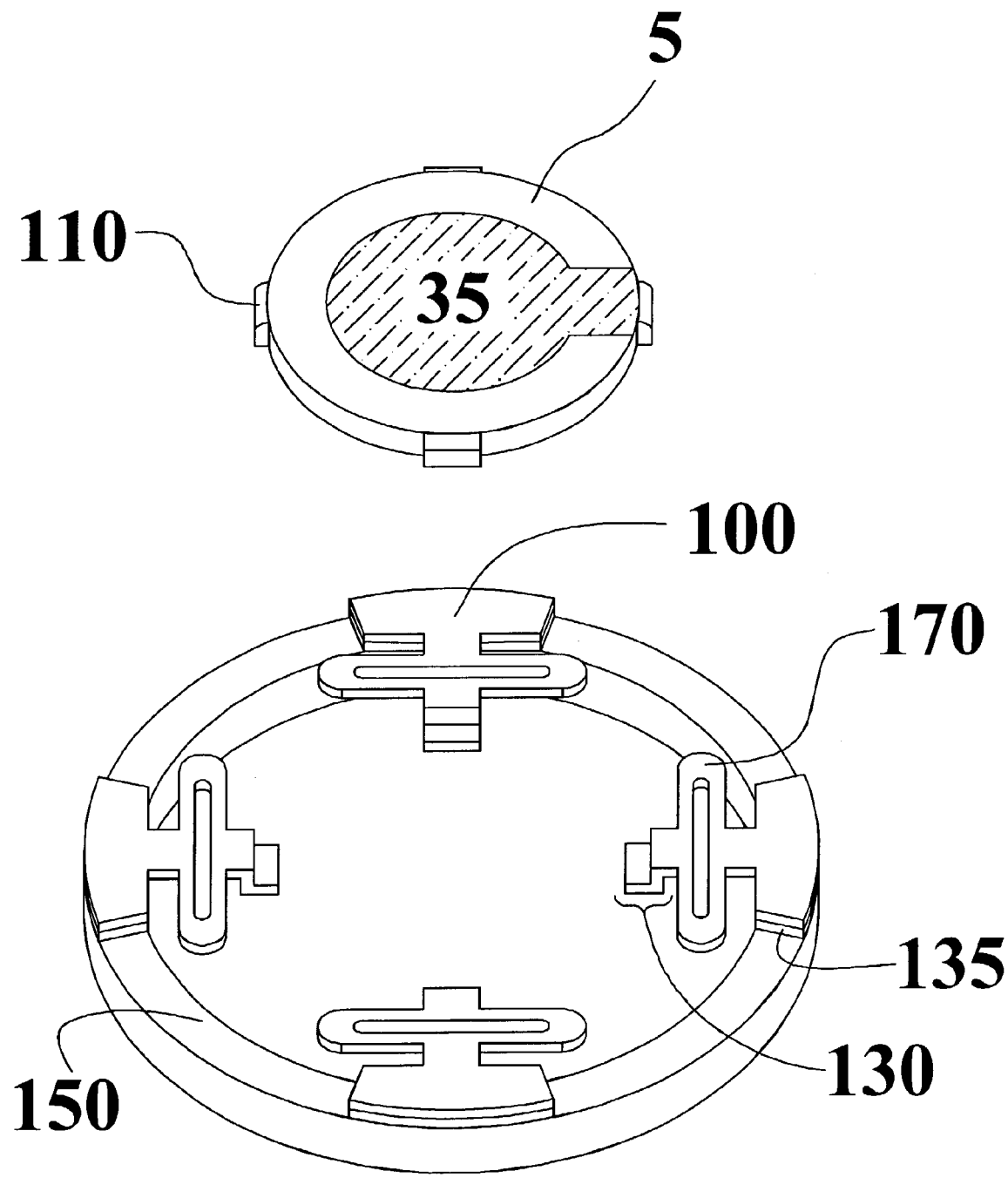
FIGS. 6a, b are detailed top and side perspective drawings of a quad mount relief (4-point) structure with formed crystal alignment tabs and a ring-shaped ceramic mounting base. The relief loop ends are designed to be oval instead of rectangular. The example shown can be mounted on or integrated within a variety of electronic package headers/ enclosures (not shown) and electrically connected with bonding wires (not shown)
Figure 6B:
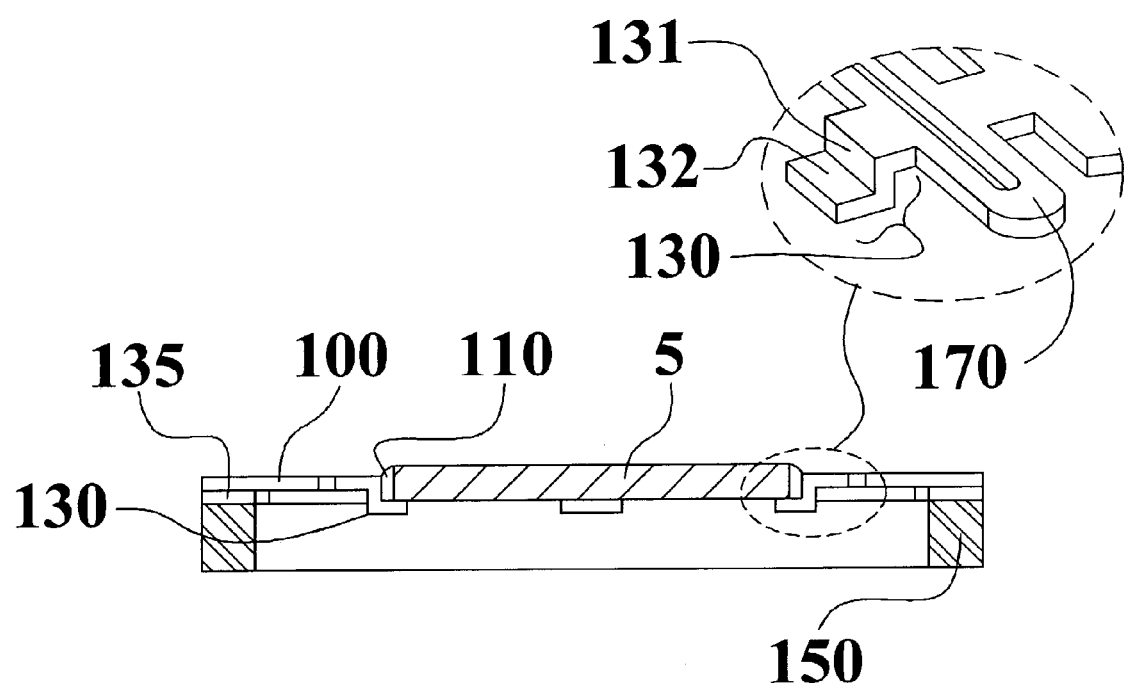

Other embodiments stated herein are applicable. FIGS. 6a and 6b show the lead frame 100 supported by a ring-shaped ceramic ring 150 instead of the machined-ceramic base. The lead frame 100 is secured to the ceramic ring 150 by an adhesive 135, although the lead frame can also be 'sandwiched' by a top element (not shown). The ring-shaped ceramic ring 150 is shown as a hollow support frame with the adhesive 135 acting as the support structure to retain the lead frame 100 in position. The hollow support frame 150 can be shaped as a ring, square or any symmetrical shape that allows the lead frames 100 to be coupled to the resonator 5.

The crystal resonator 5 is attached by an adhesive 110 to the formed lead-frame shelf 130 that helps to support and align the resonator 5 during the manufacturing process. The adhesive can be deployed on the angled portion and/or the retaining portion of the lead frame shelf 130. In this embodiment, the formed lead-frame shelf 130 has a first 90 degree bend at the point of contact with the adhesive 110 along the side of the crystal 5. This helps in the auto-alignment and an angle less than 90 degrees is permissible. There is a second 90 degree bend at the underside of the crystal 5 so that a small portion of the lead-frame shelf 130 protrudes under the crystal 5 to form a rim thereby supporting the crystal 5 as it centers itself. The relief loops 120 are elongated slotted ovals with bulbous ends 170 in this embodiment. Thus, the lead frame 100 provides the planar support as well as having the lead-frame shelf 130 allowing alignment and installation support. The whole assembly can be mounted onto the base of an electronic package (not shown) and electrically connected to the package pins using bonding wires (not shown).

Figure 7A:
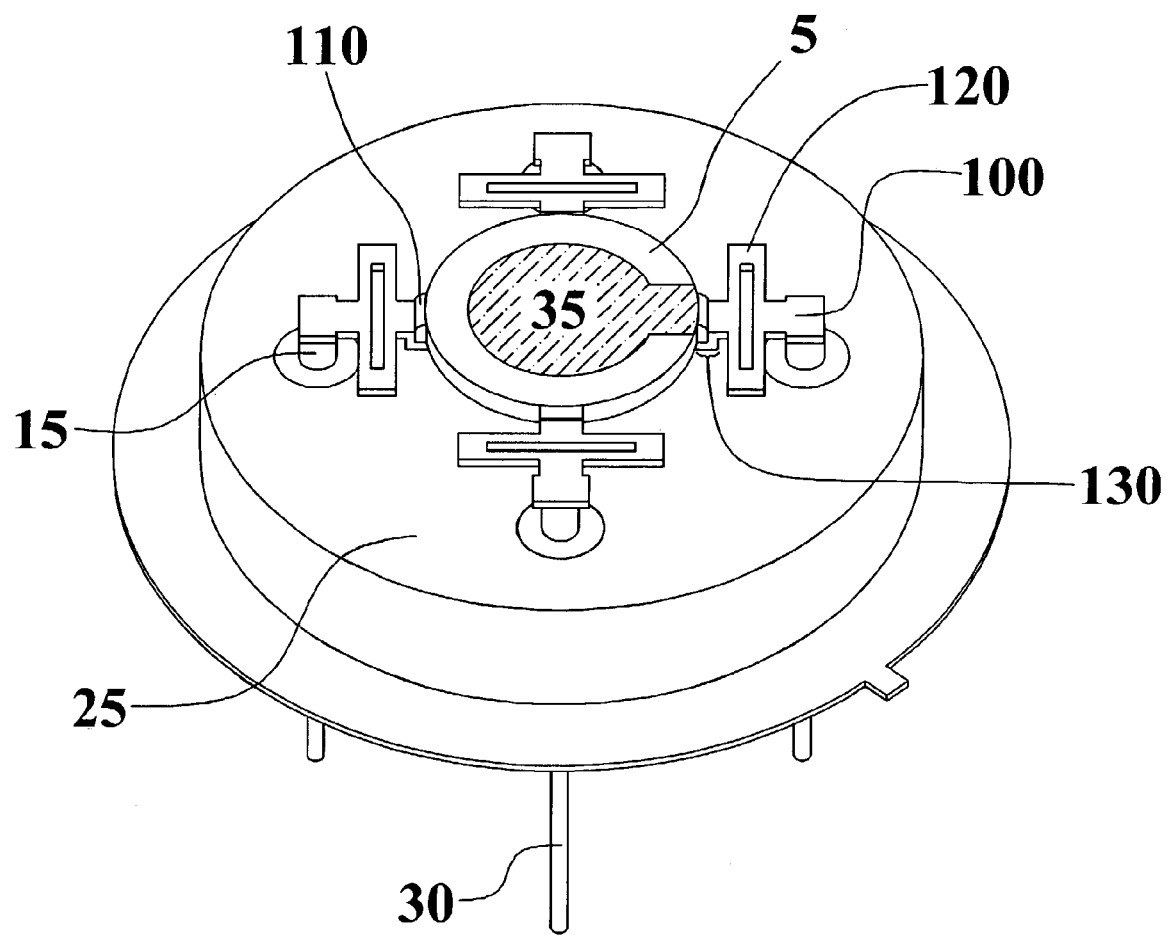
FIGS. 7a, b are detailed top and side perspective drawings of a quad mount relief structure with formed crystal alignment tabs. All of which is packaged directly onto the pins of a TO-X style header.
Figure 7B:
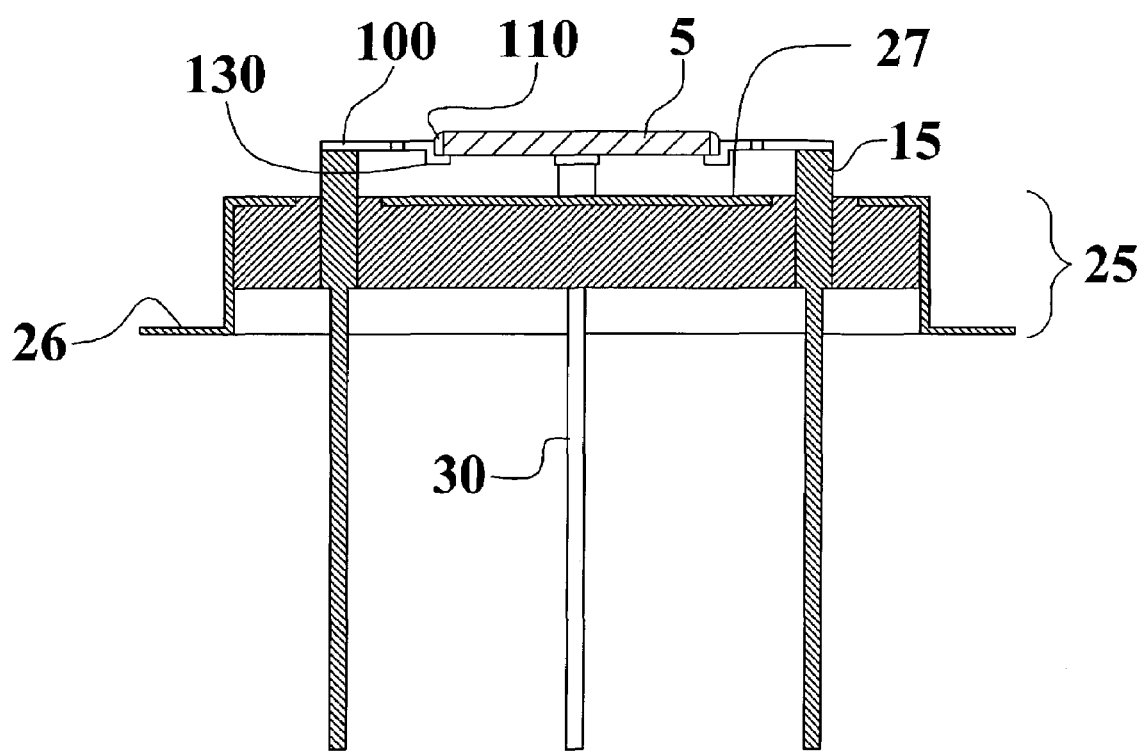

Referring to FIGS. 7a and 7b, the lead frame 100 is attached to electrical pins 15 that extend up through the TO-X style header 25. The package 25 has a package floor 26 that typically includes the electrical lead interface through the package floor 26. The package surface 27 is the planar surface nearest to the resonator 5. In this embodiment the crystal 5 is held by the lead frames 100 similar to FIGS. 6a and 6b with the lead-frame shelf 130 aligning the crystal 5. The lead frame 100, as shown, is secured to the pins 15 by clips, welding, brazing, adhesive, or solder on one end and secured to the resonator by an adhesive 110 on the crystal end. The package 25 is shown for a TO-X style round header and there are four rounded pins 15 with four corresponding lead frames 100 connected to the tops of the pins 15. In this variation the relief loops are open rectangular sections 120 within each lead frame 100. This variation eliminates the base 20 of FIG. 4a and directly couples the resonator 5 to the package 25.

Figure 8A:
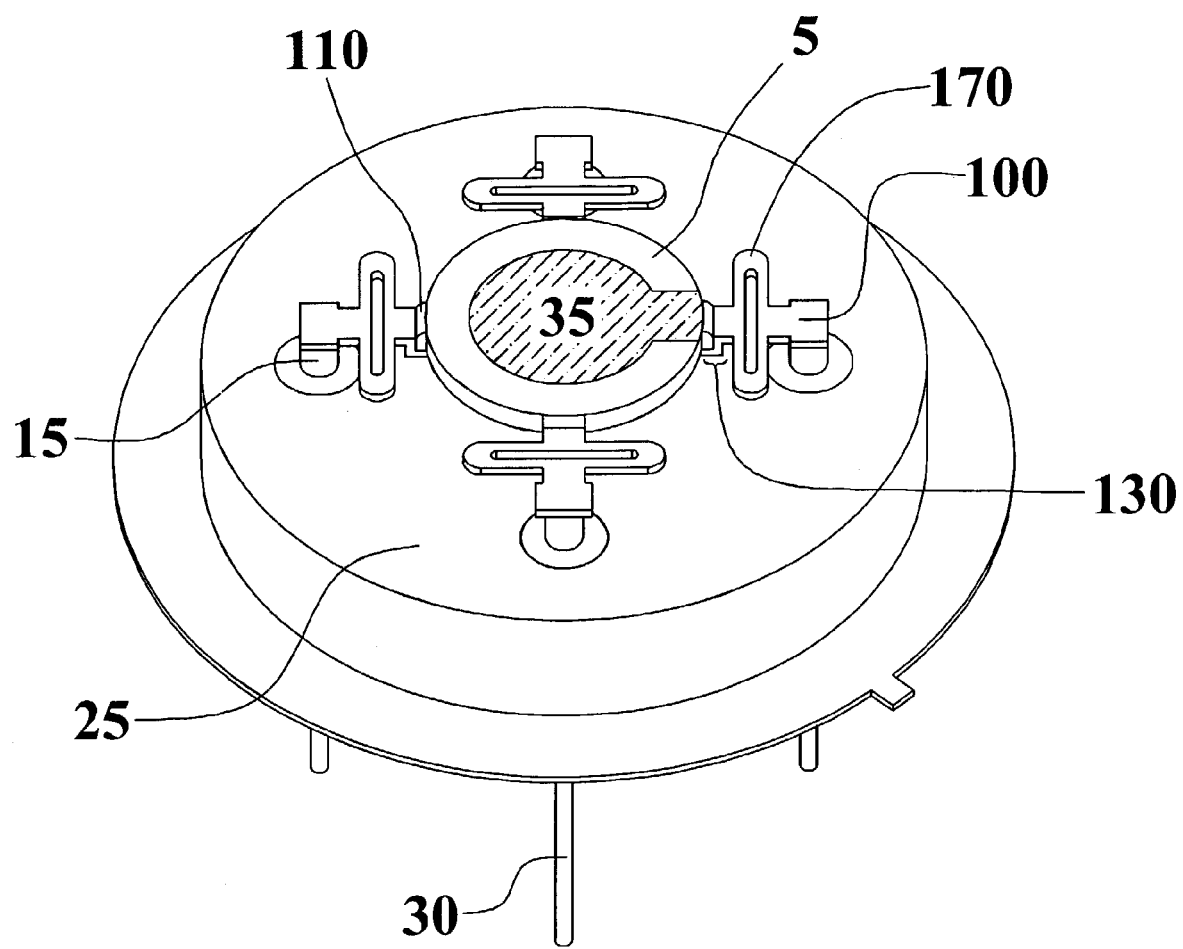
FIGS. 8a, b are detailed top and side perspective drawings of a quad mount relief structure with formed crystal alignment tabs packaged directly onto the pins of a TO-X style header. The relief loop ends are designed to be oval instead of rectangular.
Figure 8B:
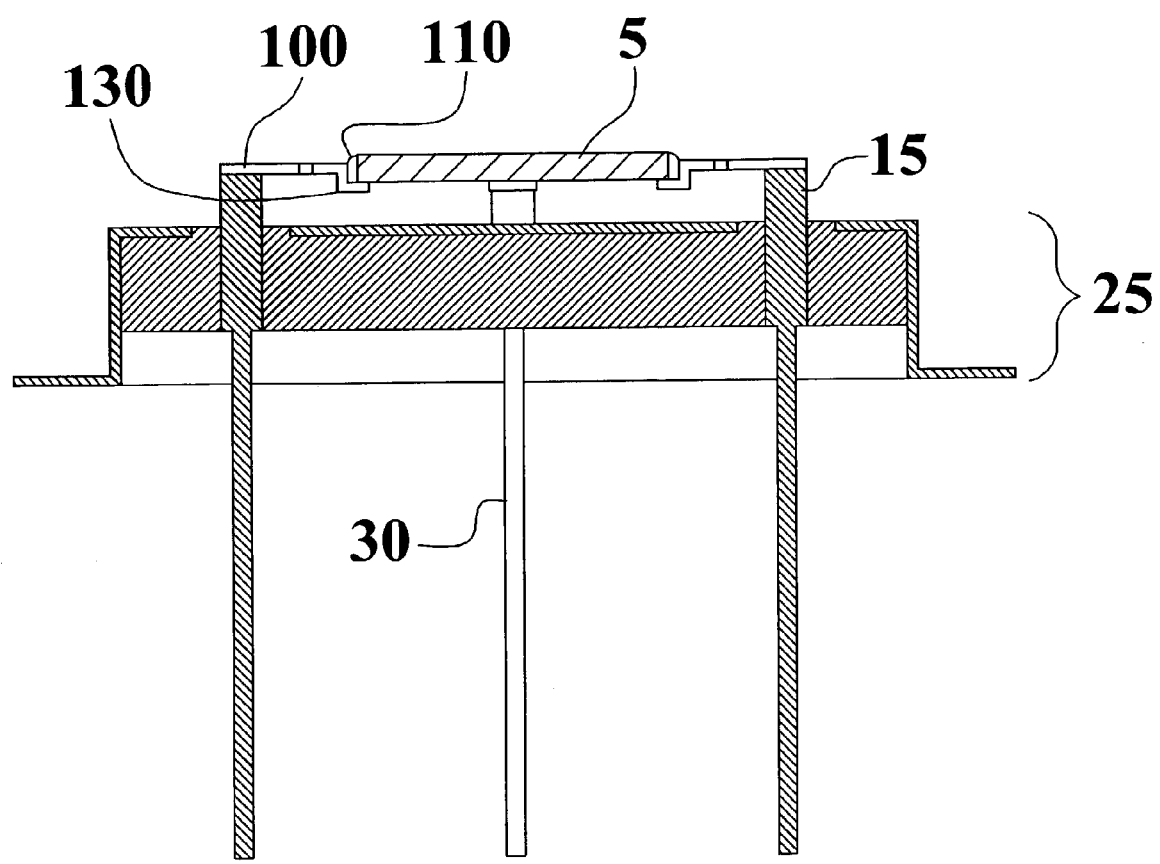

FIGS. 8a and FIG. 8b depicts the TO-X style round header package 25, but with bulbous or rounded ends in the relief loops 170. This aspect also illustrates a quad mount structure with four pins 15 coupled to the package 25 and having the lead frames 100 secured to the top of the pins 15. The lead frame 100 has the bulbous relief loop 170 interconnected to the resonator 5 applying the planar forces to retain the crystal 5. The lead-frame shelf 130 is shown along with the adhesive 110 to secure the crystal 5 to the lead frames 100.

Figure 9A:
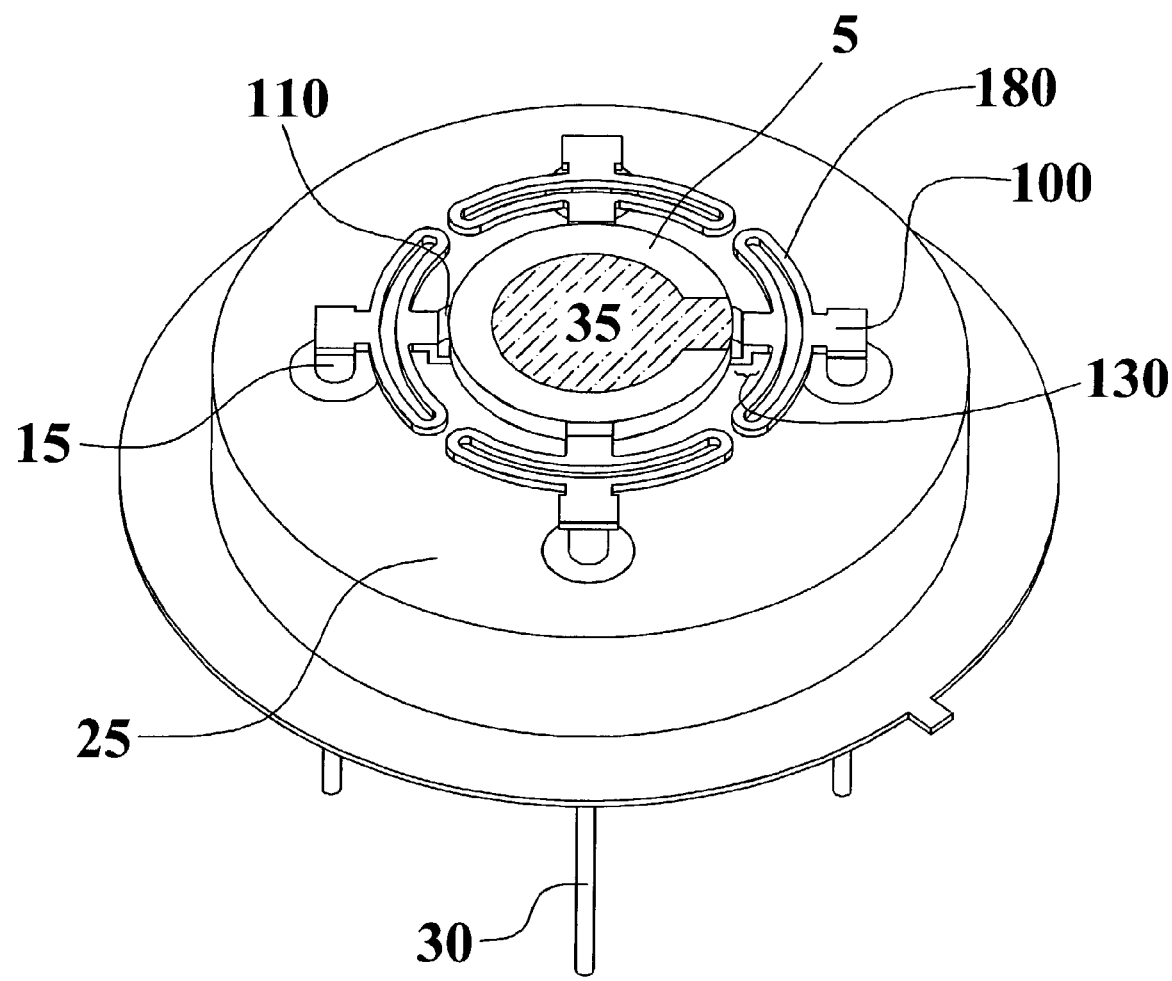
FIGS. 9a, b are detailed top and side perspective drawings of a quad mount relief structure with formed crystal alignment tabs. All of which is packaged directly onto the pins of a TO-X style header. The relief loops are designed to be arcs.
Figure 9B:
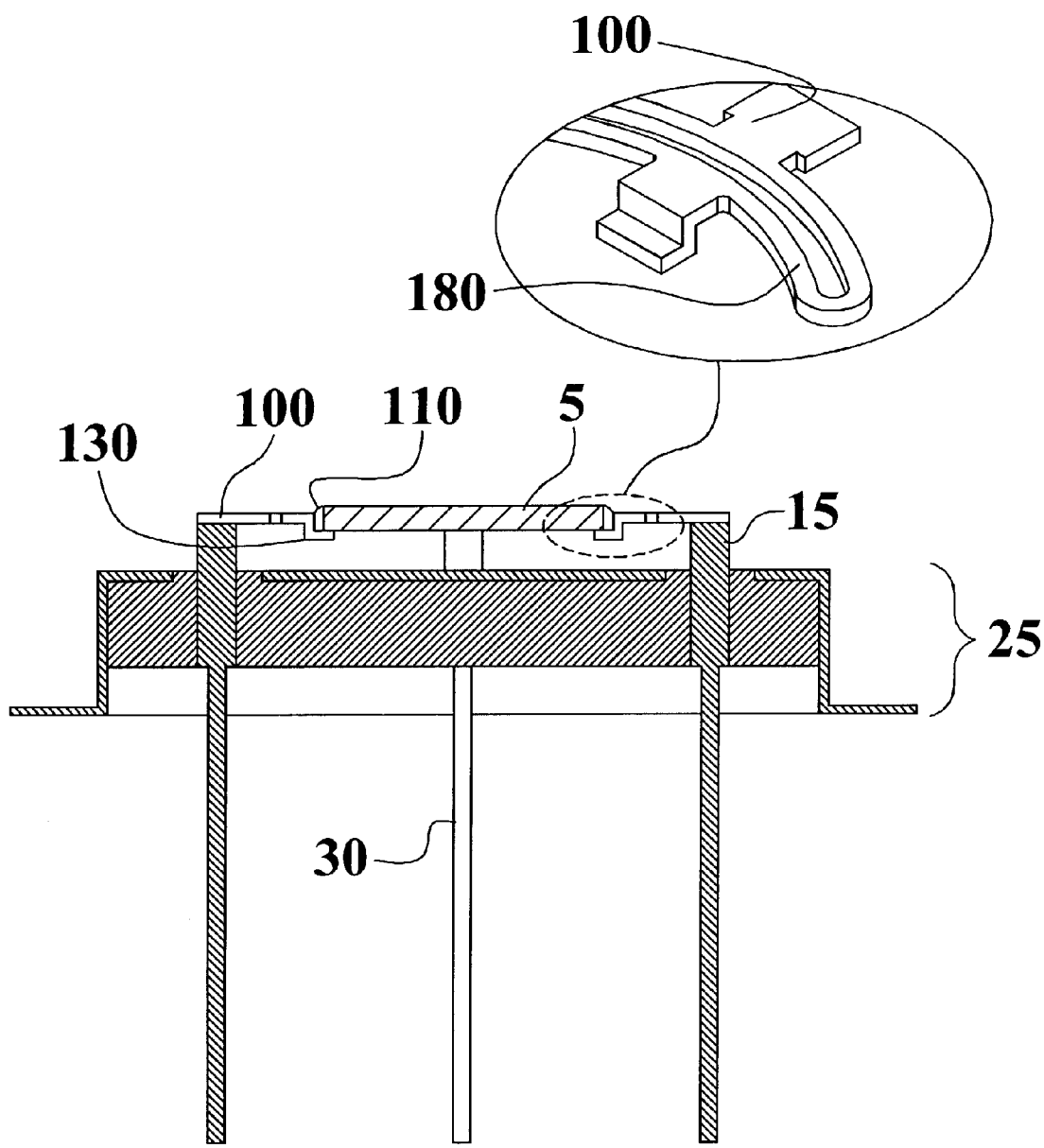

In FIGS. 9a and FIG. 9b, the quad relief mount structure for the package 25 is depicted with the arc shaped relief loops 180. Once again, there are four pins 15 in the quad mount that provides the support columns for the lead frames 100 having the arced relief loops 180.

Figure 10A:
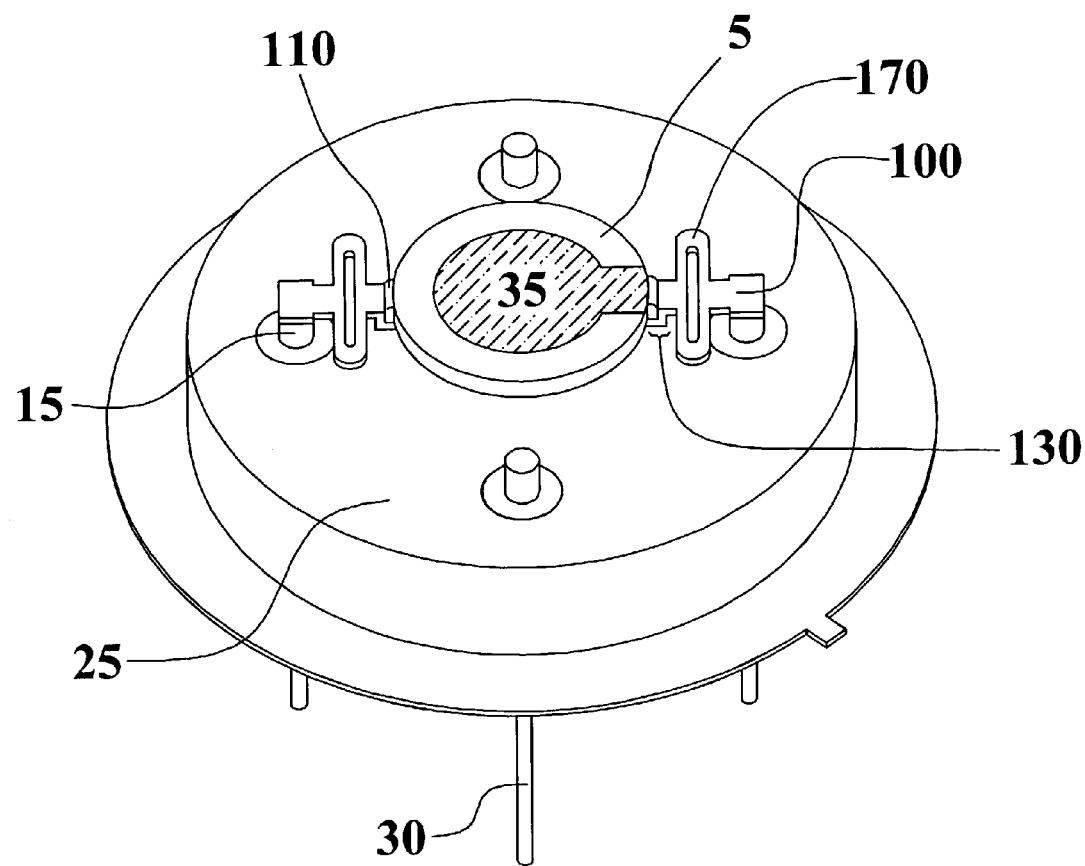
FIGS. 10a, b are detailed top and side perspective drawings of a two-point relief structure with formed crystal alignment tabs. All of which is packaged directly onto the pins of a TO-X style header. The relief loops are oval on the ends.
Figure 10B:
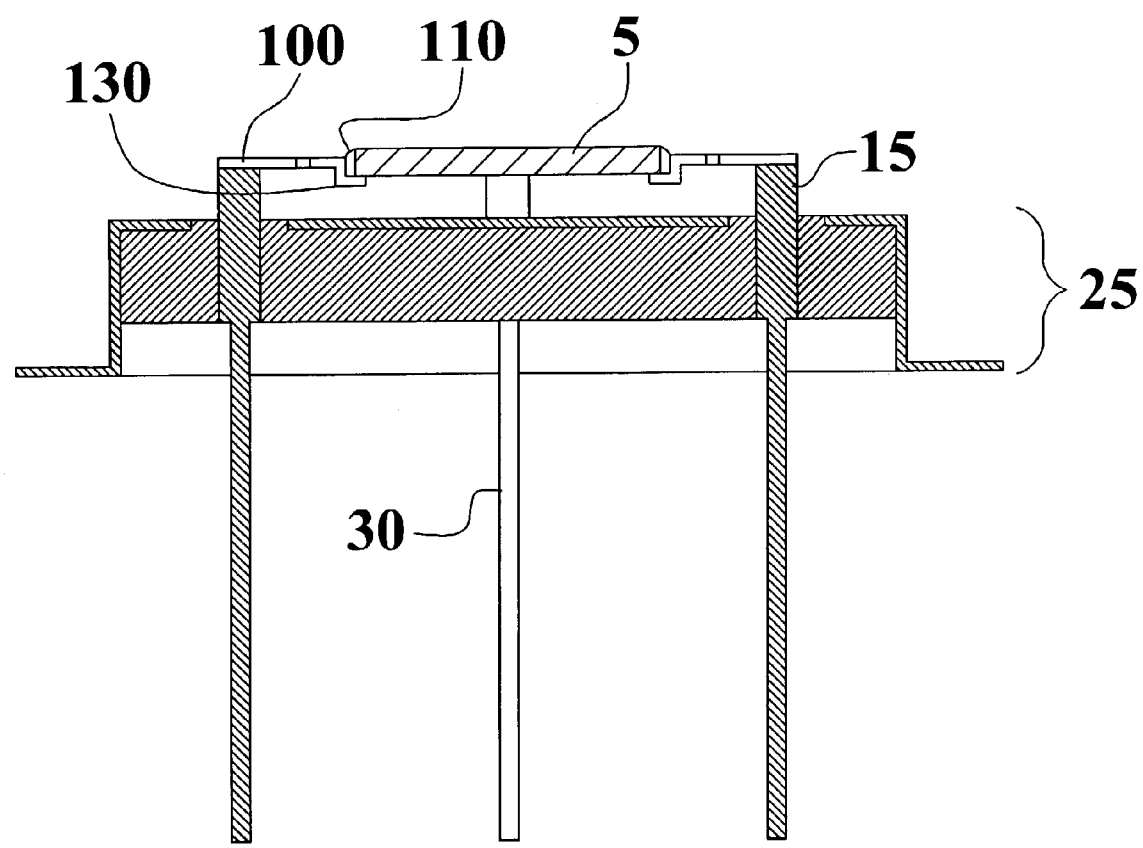

Referring to FIGS. 10a and FIG. 10b, the TO-X style round header 25 package in a two point mount is depicted having oval relief loops 170. As shown, the package can include four mounting pins 15 allowing standardized mountings whether using two point mounts or four point mounts. In the two point mount embodiment the planar force is supplied by the two opposing pins 15 each exerting an opposing force in the plane of the crystal 5.

Figure 11A:
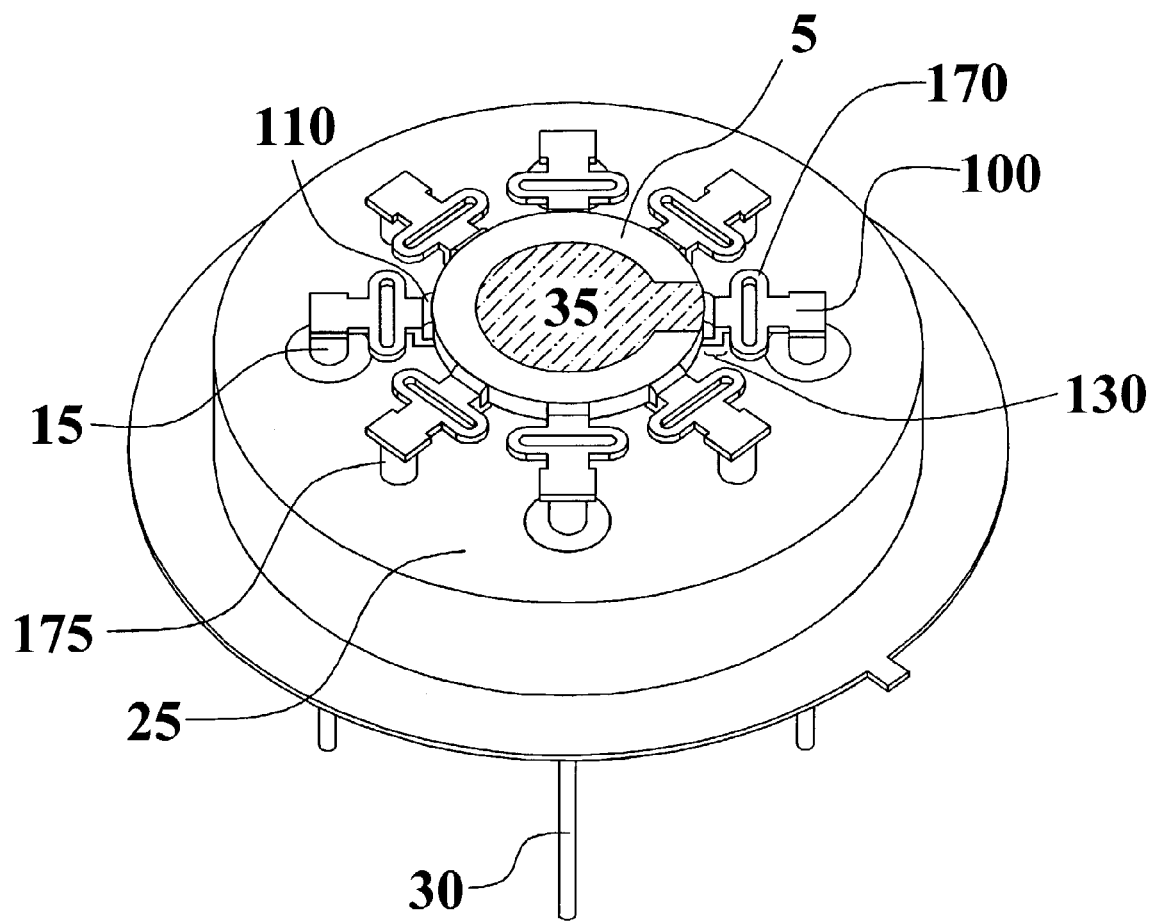
FIGS. 11a, b are detailed perspective drawings of an 8-point relief structure with formed crystal alignment tabs. All of which is packaged directly onto the pins of a TO-X style header.
Figure 11B:
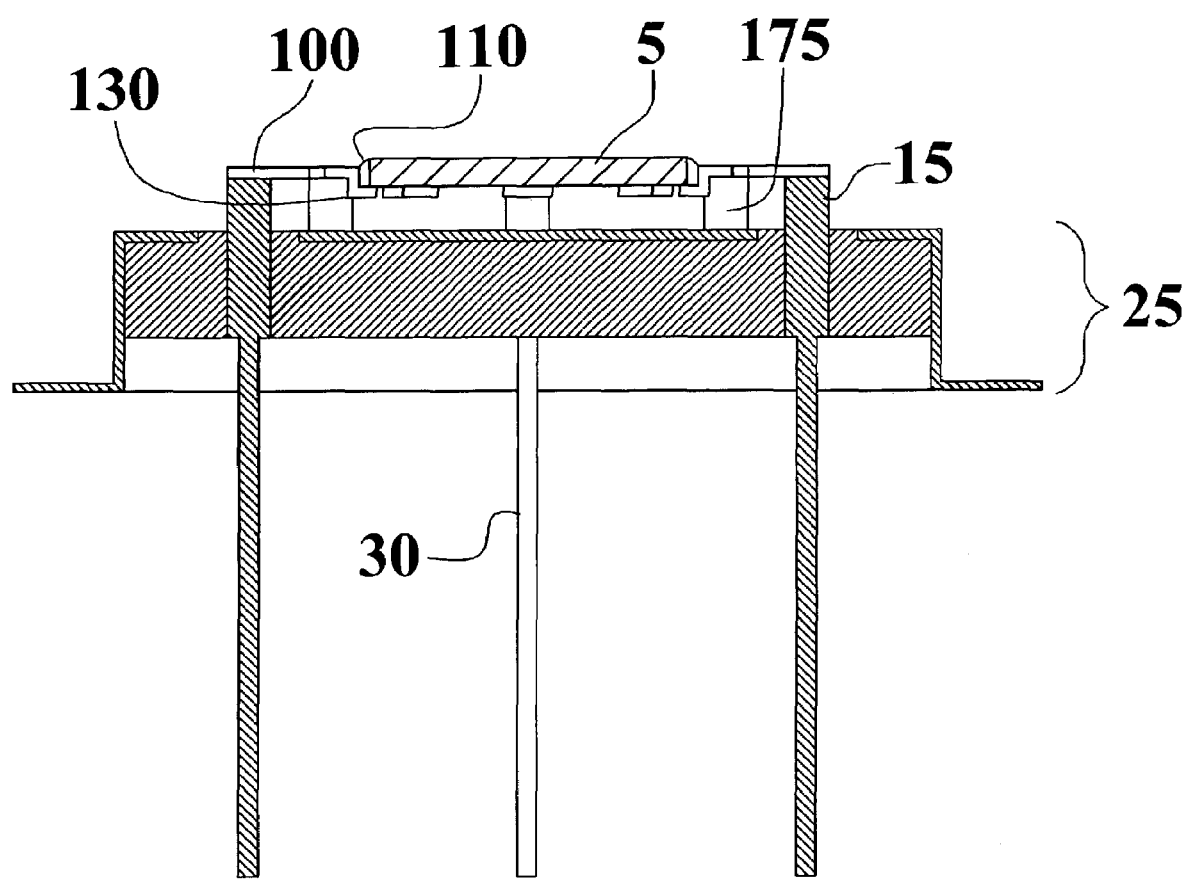

FIG. 11a and FIG. 11b depict the TO-X style round header 25 package in an eight point mount having oval relief loops 170. There are four pins 15 and four posts 175 with eight corresponding lead frames 100 each coupled to the pins/posts 15/175 on one end and secured to the crystal 5 by an adhesive 110 on the other end. One of the pins is electrically coupled to the upper electrode contact 35 while another pin couples to a lower contact (not shown). In this configuration, there are four posts 175, as there is no need to have all eight pins within the package. It is however within the scope of the invention to have only two pins electrically coupling the package and the rest posts or to have all pins providing the option for electrically coupling the package and any combinations therewith.

Figure 12A:
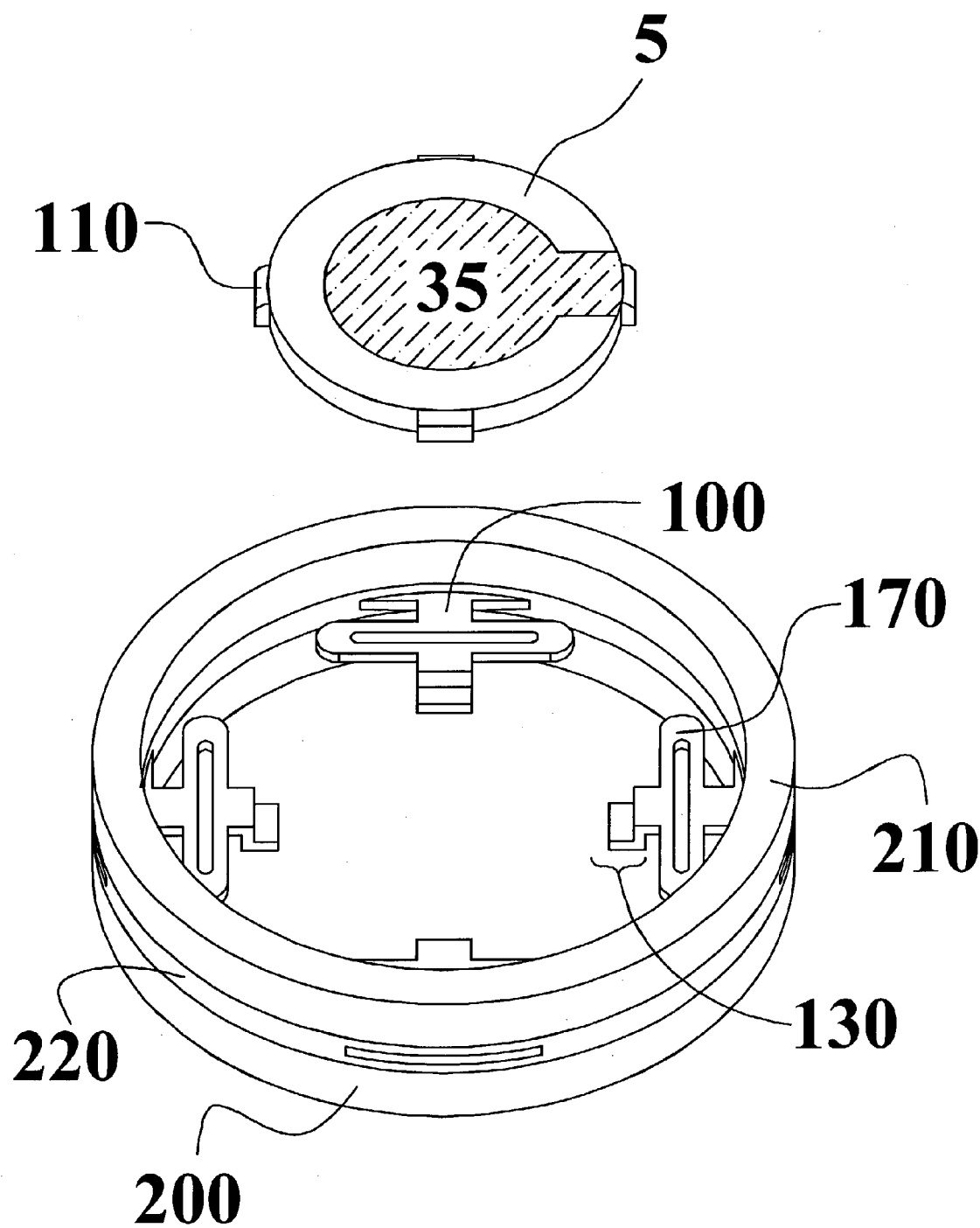
FIGS. 12a, b are detailed top and side perspective drawings of the quad relief mount sandwich structure with upper and lower ceramic bases forming rings that clamp the lead frames.
Figure 12B:
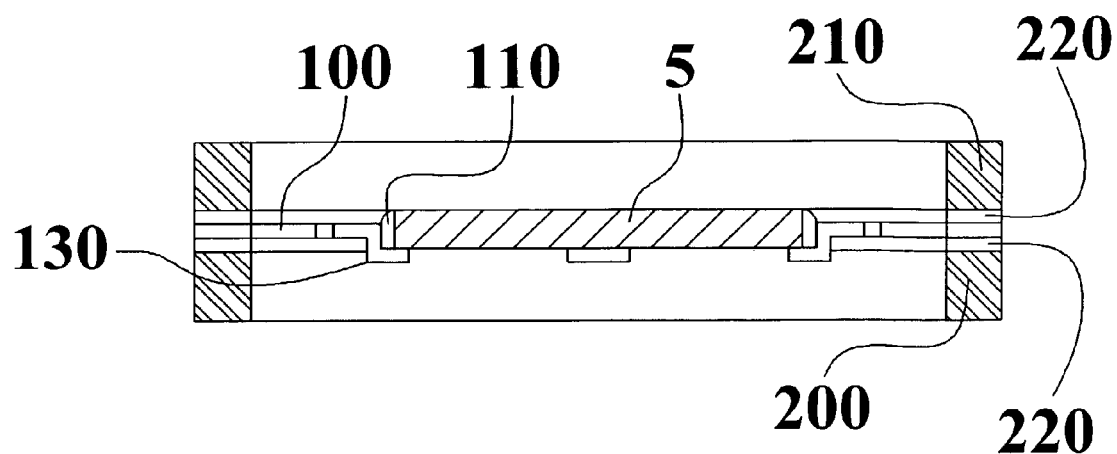

The embodiment of FIGS. 12a and 12b shows a ceramic base 200 symmetrically disposed about the periphery of the resonator 5. The lead frames 100 provide the planar retention force to hold the resonator 5 and are secured by a ceramic top member 210 also being symmetrically disposed about the periphery of the resonator 5 and mating with the hollow support frame 200. There is a non-conductive adhesive 220 filling any gap between the base 200 and the top member 210. The assembly can be mounted onto an electronic package header (not shown) and electrically connect to the package pins using bonding wires (not shown).

In the ceramic ring embodiment of FIGS. 6a and 12a, the lead frames 100 can be fabricated as a single unit using techniques such as LTCC (Low Temperature Co-fired Ceramic) technology. This reduces the assembly effort required, reduces the adhesive connections, and may improve assembly tolerances. In one variation, the lead frames 100 would have a unitary outer ring linking each of the individual lead frames at the outer ends of the lead frame or at any portion of the lead frame 100 there between, including coupling between the compliance loops 170. In addition, there may be a unitary inner ring coupling between the individual lead frame shelves 130. Regardless of how the lead frame 100 is interconnected, the lead frame 100 as a unitary structure is within the scope of the invention.

Figure 13:
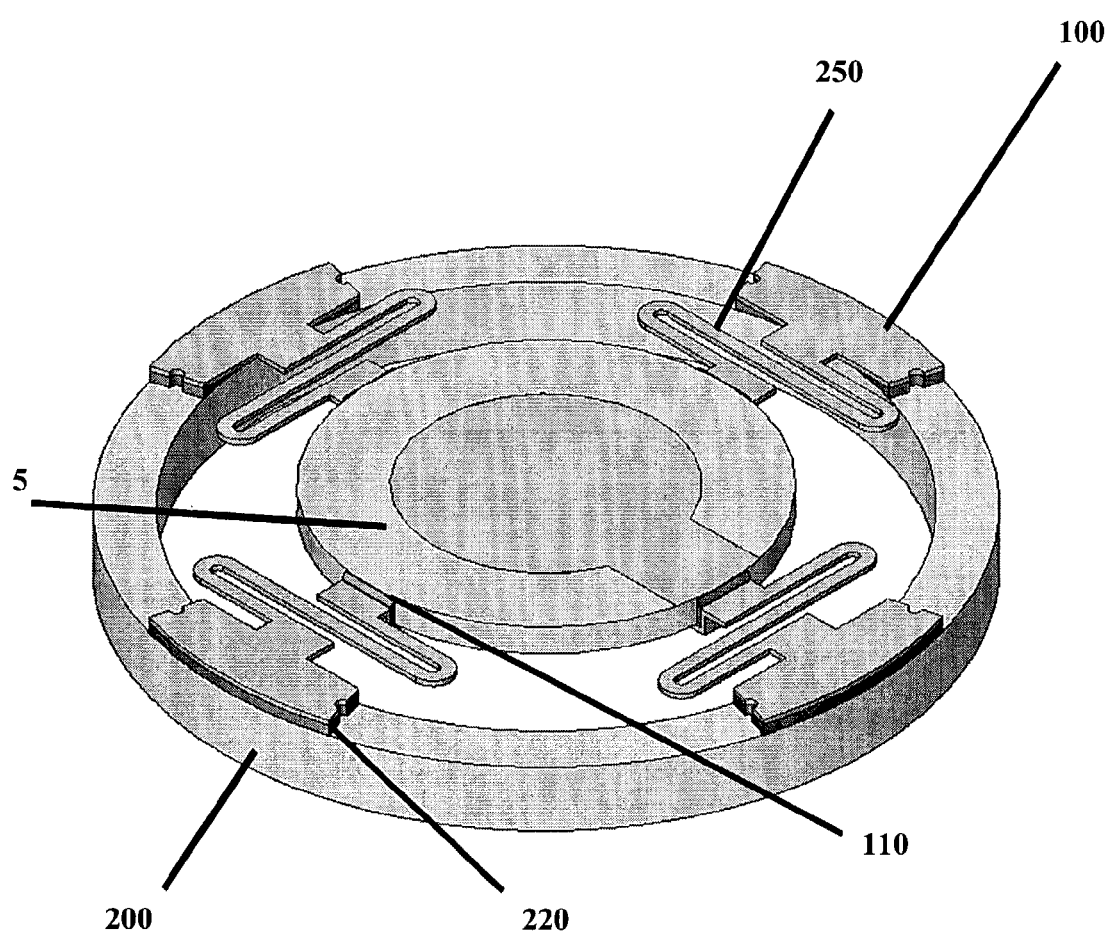
FIG. 13 is a top perspective of the quad relief mount structure for a ceramic base with a serpentine spring structure providing the compliance. The example can be mounted onto a variety of electronic package headers (not shown) and electrically connected with bonding wire (not shown)

The quad relief mount structure of FIG. 13 demonstrates that the lead frame 100 coupling to the resonator 5 can encompass other relief structures besides the compliance loops. For example, the serpentine element 250 applying the planar force provides similar benefits as the compliance loops. Additional compliant relief is accomplished with other geometry's and shapes, including a spring shape, a zig zag shape, and a long thin strip which is typically combined with a compliant adhesive. The whole assembly can be mounted onto an electronic package header (not shown) and electrically connected to the package pins using bonding wires (not shown).

Figure 14:
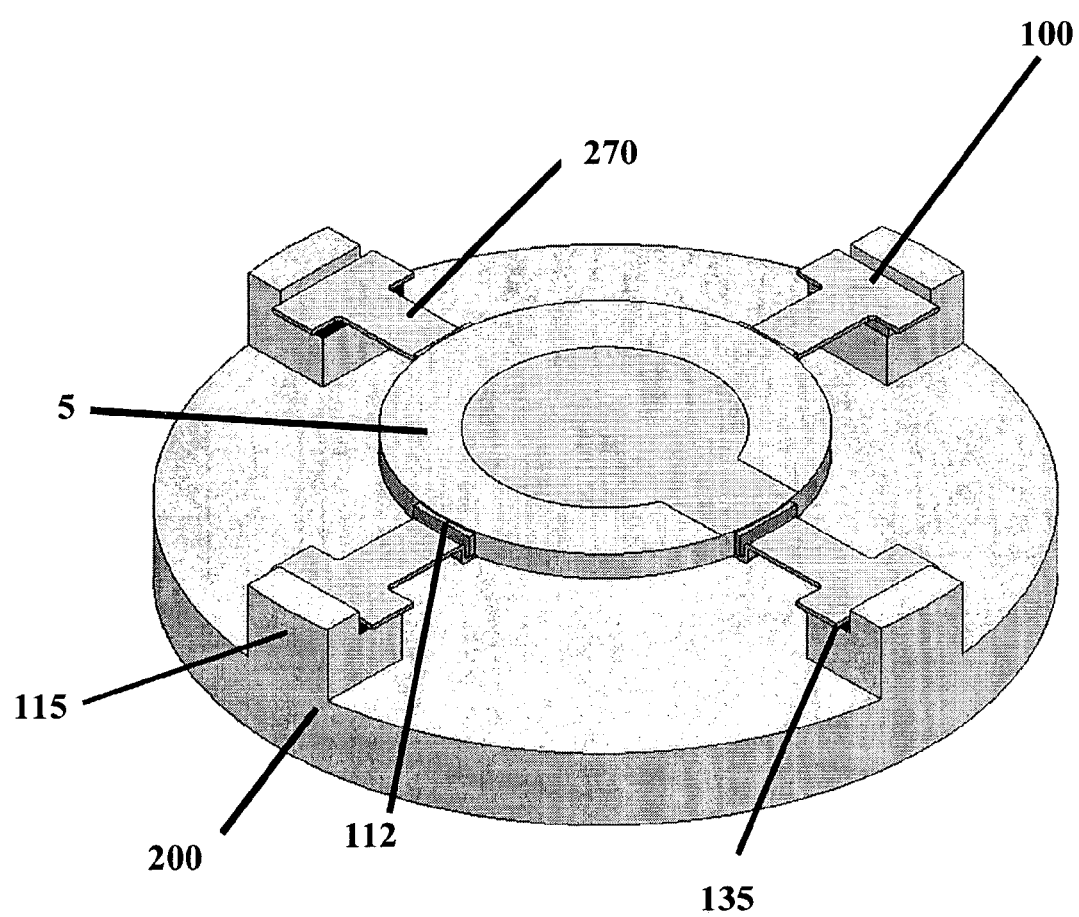
FIG. 14 is a top perspective of the quad stiff mount structure. The compliance structures are replaced with a compliant adhesive to hold the resonator element.

The embodiment shown in FIG. 14 is a Quad Stiff Mount (QSM) structure and is also in plane with the center plane of the resonator 5. Instead of using a compliance structure, a compliant adhesive 112 is used with the QSM structure to create a compliant, in-plane support structure. In this embodiment the support structures 115 are disposed about the base 200 and the lead frames 100 have a straight section 270 coupling the support structures 115 to the resonator 5 using a compliant adhesive 112. In yet another embodiment, the lead frame 100 can butt up to the resonator 5 into a plurality of formed receptacle clips (not shown) on the resonator 5.

Figure 15A:
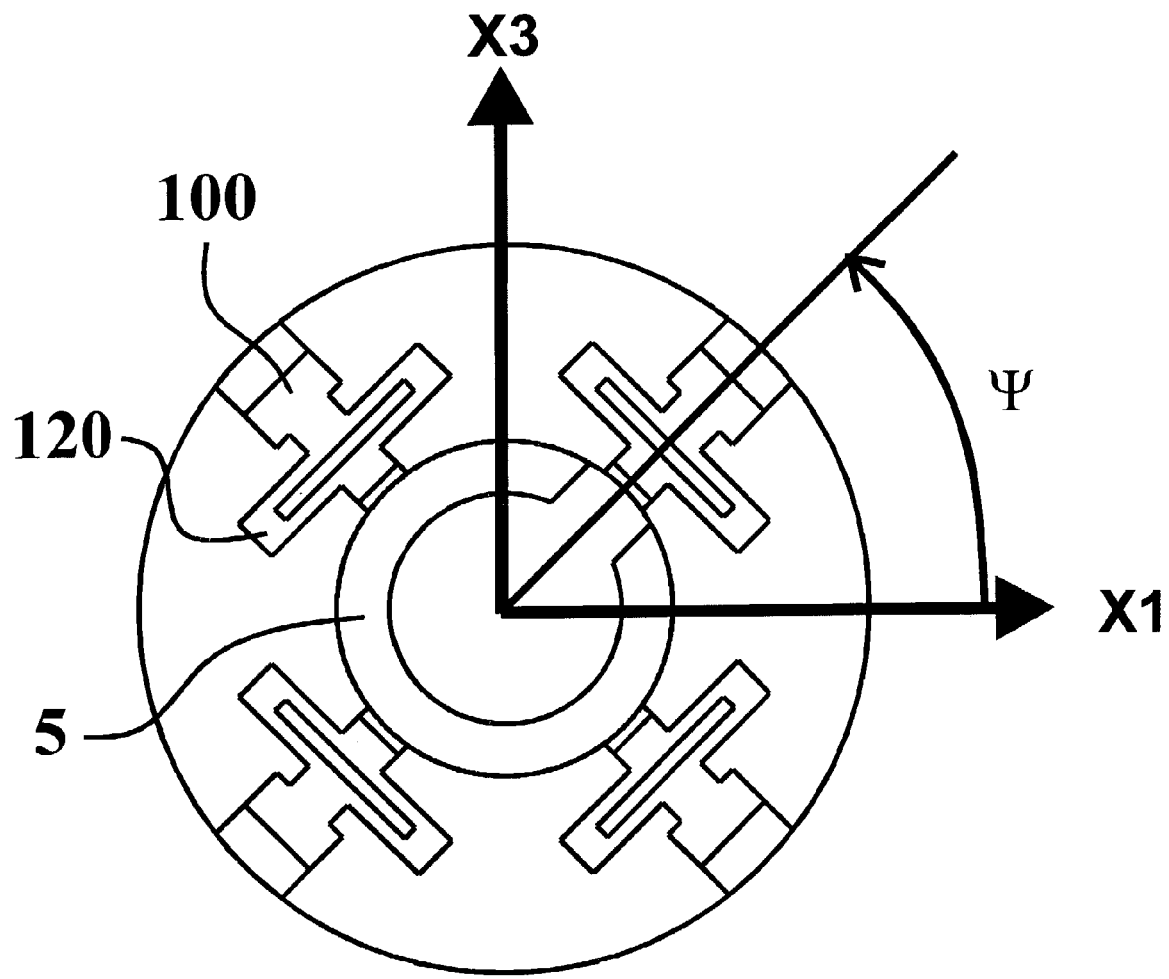
FIGS. 15a, b graphically illustrates the angle spacing between clips may be 90° with angle of the first counter-clockwise mounting position being $\Psi$ degrees off the x-axis of the piezoelectric resonator.
Figure 15B:
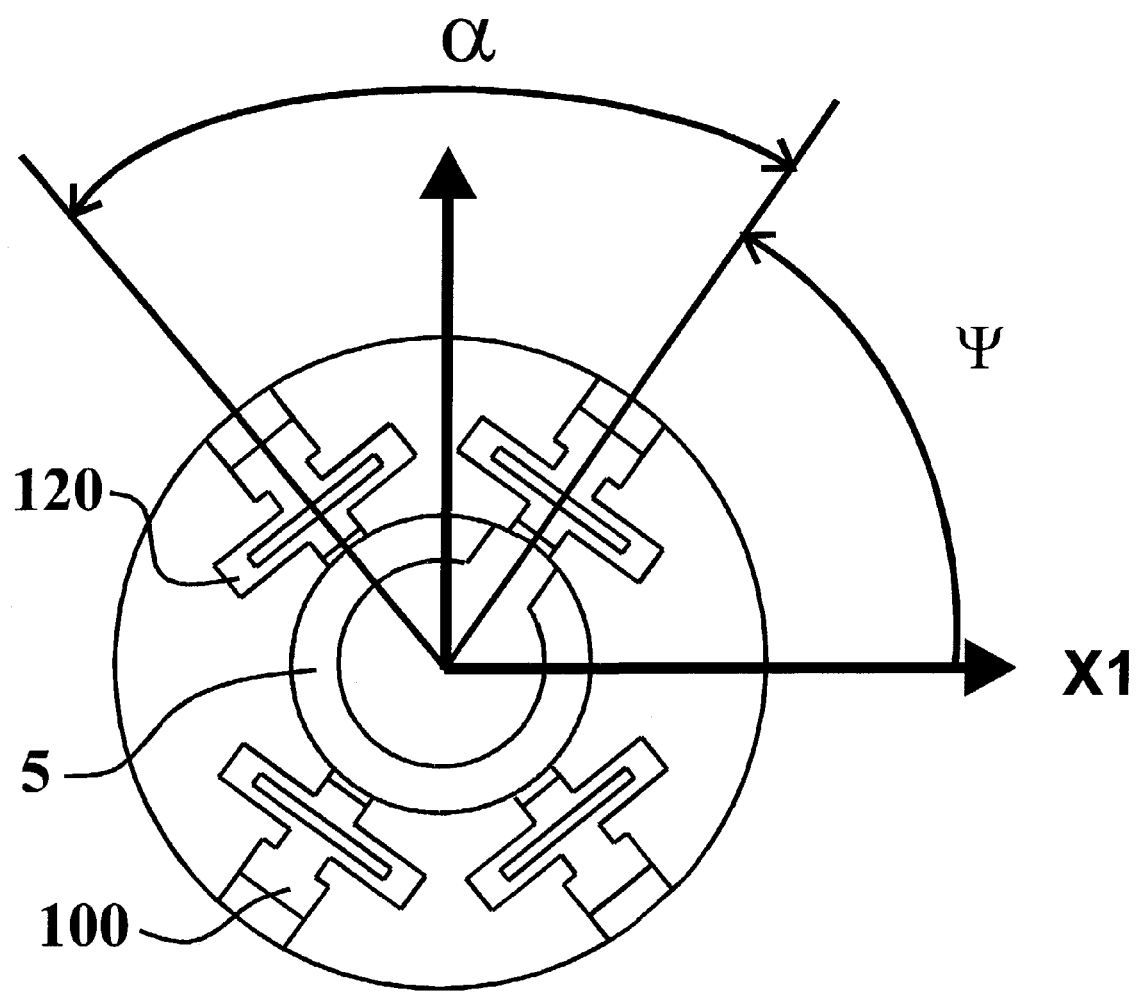
As shown in FIG. 15b, the angle spacing between the upper supports may be some other angle alpha. The top two quadrants and the bottom two quadrants are symmetrical to each other with respect to the whole mounting structure. The position of the first counter-clockwise mounting position is $\Psi$ degrees off the x-axis.

Referring to FIG. 15a and FIG. 15b, a Quad Relief Mount (QRM) structure with relief loops 120 is depicted. FIG. 15a depicts a four point mount with the angle spacing between the lead-frame 100 support locations being 90° apart relative to each other. The angular position of the first counter-clockwise lead-frame 100 support location is $\Psi$ degrees off the x-axis of the piezoelectric resonator 5. FIG. 15b depicts a QRM structure with the angle spacing between the upper supports may be some other angle $\alpha$. The top two quadrants and the bottom two quadrants are symmetrical to each other with respect to whole mounting structure. The position of the first counter-clockwise mounting position is $\Psi$ degrees off the x-axis of the resonator 5.

The angles of $\alpha$ and $\Psi$ can be chosen to optimize the acceleration sensitivity according to the choice of crystal cut angle. The advantages of varying the $\Psi$ angle mounting position relates back to experimental and theoretical work as explained by A. Ballato, E. EerNisse, and T. Lukaszek, "The Force-Frequency Effect in Doubly Rotated Quartz Resonators", Proceedings of the 31$^{st}$ IEEE International Frequency Control Symposiums pp. 8–16, 1977. Their work indicates that selecting the mounting position at appropriate $\Psi$ angles should result in reduced frequency changes due to the force-frequency effect.

As explained by T. Lukaszek and A. Ballato, "Resonators for Severe Environments", Proceedings of the 33$^{rd}$ IEEE International Frequency Control Symposium, pp. 311–321, 1979, depending upon the quartz material, the crystal orientation can be cut in different directions and get different properties. One of these properties deals with how well stress is coupled into the resonator by applied stress and influenced by the mount locations on the resonator. For example, an SC resonator can be analyzed by oppositely positioned probes and the frequency response can be measured as a function of the angular probe pair position away from the x-axis of the resonator. At certain angular locations there is no observed frequency response for an opposing pair of forces, and these locations are called the zeros. For SC cuts there are two sets of zeros that are about 90 degrees apart. For AT cut crystal the spacing between the sets of zeros is about 60 degrees and about 120 degrees. The lead frame mount pairs can be rotated to the 'sweet spots' in order to take advantage of the zeros.

Additionally, for these and other piezoelectric materials, it may be more advantageous to implement complementary mount pair positions wherein the force frequency response from one mount pair combines with the force frequency response from another mount pair resulting in a minimal net frequency response. This nulling of the frequency response by having opposingly positioned mount pairs at non-zero points is a further feature within the scope of the present invention.

It should also be noted that the present invention is not limited to use of the same lead frame mount pairs and can have different geometries for the lead frames. For example, the use of different size/shape lead frames can be employed to satisfy operating parameters. There can be differing compliance loops used for different mount pairs as well. And, the different mount pairs may be used for zero and/or non-zero points.

Numerous tests have been performed to validate the present invention. Table A shows example G-sensitivity data for the machined ceramic quad relief mount structures mounted in an HC-40 cold weld header, while Table B shows example data for the machined ceramic quad stiff mount structure mounted on flat, rectangular resistance weld header. The quad stiff mount structure did not utilize a compliant adhesive.

As can be seen for the Quad relief mount structure, there is a factor of ten improvement over typical TO-X style headers using flat metal ribbon clips which typically achieve low parts in $10^9$ per g total gamma.

Also shown is the factor of ten improvement for the quad relief mount structure over the quad stiff mount structure without compliant adhesive. This demonstrates the importance of compliance in achieving low values of acceleration sensitivity.

TABLE A

G-sensitivity data on the machined ceramic Quad Relief Mount Structure

| Dev. | ($10^{-9}$/g) | | | |
|---|---|---|---|---|
| # | $\Gamma_x^a$ | $\Gamma_y^a$ | $\Gamma_z^a$ | $|\Gamma|$ |
| QRM-1 | 0.08 | 0.13 | 0.11 | 0.19 |
| QRM-2 | 0.09 | 0.11 | 0.12 | 0.19 |
| QRM-3 | 0.33 | 0.12 | 0.11 | 0.37 |
| QRM-4 | 0.09 | 0.12 | 0.08 | 0.17 |
| QRM-5 | 0.30 | 0.15 | 0.37 | 0.50 |
| QRM-6 | 0.09 | 0.17 | 0.12 | 0.23 |
| QRM-7 | 0.25 | 0.09 | 0.25 | 0.36 |
| QRM-8 | 0.10 | 0.10 | 0.13 | 0.19 |
| Average | | | | 0.27 |

TABLE B

G-sensitivity data on the machined Quad Stiff Mount Structure

| Dev. | ($10^{-9}$/g) | | | |
|---|---|---|---|---|
| # | $\Gamma_x^a$ | $\Gamma_y^a$ | $\Gamma_z^a$ | $|\Gamma|$ |
| QSM-1 | 0.29 | 1.98 | 1.70 | 2.63 |
| QSM-2 | 1.15 | 2.00 | 1.52 | 2.76 |
| QSM-3 | 0.48 | 1.52 | 2.87 | 3.28 |
| Average | | | | 2.89 |

Other applications and variations have been contemplated and are within the scope of the invention. For example, the present invention is applicable to Surface Acoustic Wave (SAW) devices, Bulk Acoustic Wave (BAW) devices, and the Langasite family of resonators. BAW and SAW sensors use the same types of piezoelectric elements as used in precision timing applications, although generally used for monitoring environmentally or chemically altered frequency changes. If there is any vibration experienced in the environment in which the sensors reside then the sensors will experience the same sort of issues as precision clocks.

The assembly can be constructed by first symmetrically affixing clips onto the resonator blank and then attaching these clips to the ends of an unformed lead of the lead frames. In this scheme the resonator and clips can be coupled independently and subsequently incorporated onto the package by connecting the ends of the clips to the pins or lead frames that would facilitate the symmetrical alignment with respect to the resonator. Different embodiments of the clips are envisioned that improves symmetry.

It should be readily apparent to those skilled in the art that the presentation of the TO-X style headers is not to be considered a limiting factor. Other packages and enclosures are within the scope of the present invention such as the raceway headers and integrated packages.

The preferred embodiment described herein and illustrated in the figures should not be construed as in any way limiting. The foregoing description of the embodiments of the invention has been presented for the purposes of illustration and description. The invention is susceptible of many variations, all within the scope of the specification, figures. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A resonator structure, comprising:
   a resonator having a first side, a second side, and an outer edge;
   a mounting base having a planar surface, said resonator situated substantially parallel to said planar surface of said mounting base;
   a plurality of support structures located on said planar surface of said mounting base; and
   a plurality of lead frames coupled to said support structures on a first end and coupled to said edge of said resonator on a second end, said lead frames exerting a substantially planar force about a center plane of said resonator, wherein said lead frames and said resonator are substantially planar and wherein at least one of said lead frames has an integrted compliance member.

2. The resonator structure according to claim 1, wherein said compliance member is selected from at least one of the group consisting of a rectangular relief loop, an oval relief loop, an arc relief loop, a serpentine, a spring, a zig-zag, and an elongated thin strip.

3. The resonator structure according to claim 1, wherein there are four lead frames symmetrically situated about said resonator.

4. The resonator structure according to claim 1, wherein said resonator has a plurality of zero points, and wherein the lead frames are positioned at some of said zero points.

5. The resonator structure according to claim 1, wherein said resonator has a plurality of non-zero points, and wherein the lead frames are opposingly positioned at said non-zero points.

6. The resonator structure according to claim 1, wherein to lead frames are affixed to said resonator by an adhesive.

7. The resonator structure according to claim 1, wherein the lead frames are coupled as a unitary structure.

8. The resonator structure according to claim 1, wherein said lead frame has a lead frame shelf.

9. The resonator structure according to claim 8, wherein said lead frame shelf has an angled portion and a retaining portion.

10. The resonator structure according to claim 1, wherein a means for securing said lead frames to said support structures is selected from at least one of the group consisting of: clips, brazing, welding, soldering, and an adhesive.

11. The resonator structure according to claim 1, wherein some of said support structures are posts.

12. The resonator structure according to claim 11, wherein some of said posts are electrically conducting pins extending through said mounting base.

13. The resonator structure according to claim 1, wherein some of said support structures are notched pedestals.

14. The resonator structure according to claim 1, further comprising a header with a plurality of electrically conducting pins, wherein said base is mounted to said header, and wherein said resonator is electrically coupled to said electrical pins by bonding wires.

15. The resonator structure according to claim 14, further comprising a lid covering said resonator structure.

16. The resonator structure according to claim 1, wherein said resonator is a symmetrical shape.

17. A resonator structure, comprising:
   a resonator having a first side, a second side, and an outer edge;
   a hollow support frame having a top surface;
   a plurality of lead frames coupled to said top surface on a first end and coupled to said edge of said resonator on a second end, said lead frames exerting a substantially planar force about a center plane of said resonator, and wherein at least one of said lead frames has an integrated compliance member.

18. The resonator structure according to claim 17, farther comprising a top member, wherein said lead frames are sandwiched between said hollow support frame and said top member.

19. A resonator structure, comprising:
   a resonator having a first side, a second side, an outer edge and a plurality of non-zero points;
   a mounting base having a planar surface, said resonator situated generally parallel to said planar surface of said mounting base;
   a plurality of support structures located on said planar surface of said mounting base; and
   a plurality of lead frames coupled to said support structures on a first end and coupled to said edge of said resonator on a second end, wherein the lead frames axe opposingly positioned at said non-zero points.

* * * * *